United States Patent
Romanczyk et al.

(10) Patent No.: US 11,557,539 B1
(45) Date of Patent: Jan. 17, 2023

(54) SEMICONDUCTOR DEVICE FOR RF INTEGRATED CIRCUIT

(71) Applicant: MONDE Wireless Inc., Goleta, CA (US)

(72) Inventors: Brian Romanczyk, Goleta, CA (US); Matthew Guidry, Goleta, CA (US)

(73) Assignee: MONDE WIRELESS INC., Goleta, CA (US)

( * ) Notice: Subject to any disclaimer, the term of this patent is extended or adjusted under 35 U.S.C. 154(b) by 0 days.

(21) Appl. No.: 17/748,487

(22) Filed: May 19, 2022

Related U.S. Application Data

(63) Continuation of application No. PCT/US2021/064364, filed on Dec. 20, 2021.

(51) Int. Cl.
| | |
|---|---|
| *H01L 29/778* | (2006.01) |
| *H01L 23/528* | (2006.01) |
| *H01L 29/20* | (2006.01) |
| *H01L 23/522* | (2006.01) |
| *H01L 23/36* | (2006.01) |
| *H01L 25/00* | (2006.01) |
| *H01L 23/498* | (2006.01) |

(52) U.S. Cl.
CPC ......... *H01L 23/5283* (2013.01); *H01L 23/36* (2013.01); *H01L 23/49872* (2013.01); *H01L 23/5226* (2013.01); *H01L 25/00* (2013.01); *H01L 29/2003* (2013.01); *H01L 29/778* (2013.01); *H01L 29/7781* (2013.01); *H01L 29/7786* (2013.01); *H01L 29/7787* (2013.01)

(58) Field of Classification Search
None
See application file for complete search history.

(56) References Cited

U.S. PATENT DOCUMENTS

| | | | |
|---|---|---|---|
| 2005/0258548 A1* | 11/2005 | Ogawa | H01G 4/236 257/737 |
| 2013/0119543 A1 | 5/2013 | Yu et al. | |
| 2014/0159118 A1 | 6/2014 | Lenci et al. | |
| 2016/0380090 A1 | 12/2016 | Roberts et al. | |
| 2017/0025349 A1* | 1/2017 | Wood | H01L 21/76897 |
| 2018/0033776 A1* | 2/2018 | Chern | H01L 25/50 |
| 2018/0269188 A1 | 9/2018 | Yu et al. | |
| 2019/0385995 A1 | 12/2019 | Metras et al. | |

(Continued)

OTHER PUBLICATIONS

Sun, R. "GaN Power Integration for High Frequency and High Efficiency Power Applications: A Review" IEEE Emerg. Tech. for Energ. Inter. Jan. 17, 2020 pp. 15529-15542 (Year: 2020).*

(Continued)

*Primary Examiner* — Grant S Withers
(74) *Attorney, Agent, or Firm* — Jenkins, Wilson, Taylor & Hunt, P.A.

(57) ABSTRACT

In order to reduce costs as well as to effectively dissipate heat in certain RF circuits, a semiconductor device of the circuit can include one or more active devices such as transistors, diodes, and/or varactors formed of a first semiconductor material system integrated onto (e.g., bonded to) a base substrate formed of a second semiconductor material system that includes other circuit components. The first semiconductor material system can, for example, be the III-V or III-N semiconductor system, and the second semiconductor material system can, for example be silicon.

20 Claims, 24 Drawing Sheets

(56) References Cited

U.S. PATENT DOCUMENTS

| | | | | |
|---|---|---|---|---|
| 2020/0135766 A1* | 4/2020 | Dutta | .................. | H01L 21/0254 |
| 2020/0227407 A1* | 7/2020 | Radosavljevic | .... | H01L 25/0655 |
| 2020/0350425 A1* | 11/2020 | Dutta | .................. | H01L 29/7783 |
| 2021/0005531 A1* | 1/2021 | Disney | ................ | H01L 23/5226 |
| 2021/0151428 A1* | 5/2021 | Dutta | .................... | H01L 23/481 |

OTHER PUBLICATIONS

Notification of Transmittal of the International Search Report and the Written Opinion of the International Searching Authority, or the Declaration for International Application No. PCT/US21/64364 (dated Mar. 9, 2022).

Martin et al., "Design of GaN-based Balances Cascode Cells for Wide-band Distributed Power Amplifier", 2nd European Microwave Integrated Circuits Conference, pp. 1-4 (Oct. 2007).

Wu et al., "Very-High Power Density AlGaN/GaN HEMTs", IEEE Transactions on Electron Devices, vol. 48, No. 3, pp. 1-5 (Mar. 2001).

Thibeault et al., "High Performance and Large Area Flip-Chip Bonded AlGaN/GaN MODFETs", IEEE, pp. 1-4 (1997).

Then et al., "3D heterogeneous integration of high performance high-K metal gate GaN NMOS and Si PMOS transistors on 300mm high-resistivity Si substrate for energy-efficient and compact power delivery, RF (5G and beyond) and SoC applications", Intel Corporation, pp. 1-4 (2019).

Hancock et al., "Heterogeneous and 3D Integration at DARPA", IEEE International 3D Integration Conference, pp. 1-4 (2019).

Gutierrez-Aitken et al., "A Meeting of Materials", IEEE Microwave Magazine, pp. 1-14 (Mar.-Apr. 2017).

Chao et al., "Low-Temperature Bonded GaN-on-Diamond HEMTs With 11 W/mm Output Power at 10 GHz", IEEE Transactions on Electron Devices, vol. 62, No. 11, pp. 1-7 (Nov. 2015).

Cohen et al., "Near-Junction Microfluidic Therman Management of RF Power Amplifiers", IEEE International Conference on Microwaves, Communications, Antennas and Electronic Systems, pp. 1-8 (Nov. 2-4, 2015).

Poust et al., "Selective growth of Diamond in Thermal Vias for GaN HEMTs", IEEE, pp. 1-4 (2013).

* cited by examiner

SEMICONDUCTOR DEVICE FOR RF INTEGRATED CIRCUIT

RELATED APPLICATIONS

This application is a continuation of and claims priority to PCT Application Ser. No. PCT/US2021/064364, filed Dec. 20, 2021, the disclosure of which is incorporated herein by reference in its entirety.

TECHNICAL FIELD

The current disclosure relates to semiconductor devices, and in particular devices that can be configured to operate as RF integrated circuits.

BACKGROUND

Silicon integrated circuit (IC) processes, in which all circuit components are monolithically integrated on a silicon substrate, are commonly used to fabricated a variety of circuits. For certain radio frequency (RF) electronics applications, III-V semiconductors may offer performance advantages over silicon for several of the active devices of the circuit based on their superior material properties. However, in the case of III-V RF integrated circuits, many of the passive components (e.g., capacitors, inductors, interconnects, etc) take up a substantial amount of space on the III-V substrate and do not provide any substantial performance advantage relative to similar devices formed on silicon, thereby resulting in substantial added cost relative to silicon IC's.

SUMMARY

In a first aspect of this disclosure, a semiconductor device can include a base substrate and a transistor connected to the base substrate. The base substrate can include a substrate layer comprising a semiconductor or insulator material, the substrate layer having a front side and a back side opposite the front side. The base substrate can further include a first plurality of vias that each extend through an entirety of the thickness of the substrate layer, a first metal material in each via of the first plurality of vias, a backside metal material overlying the back side of the substrate layer and contacting the first metal material in each via of the first plurality of vias, and an interconnect metal on the front side of the substrate layer. The transistor can include a III-N material structure. The III-N material structure can include a III-N barrier layer and a III-N channel layer on an N-face of the III-N barrier layer, wherein the III-N barrier layer has a larger bandgap than the III-N channel layer, as well as a two-dimensional electron gas (2DEG) channel in the III-N channel layer adjacent to the interface between the III-N channel layer and the III-N barrier layer. The transistor can further include a plurality of contacts, the plurality of contacts including a source contact, a drain contact, and a gate contact. The source, gate, and drain contacts may be on an opposite side of the III-N channel layer from the III-N barrier layer, and the source and drain contacts may be electrically connected to the 2DEG channel. The transistor can be over the front side of the base substrate, such that the substrate layer of the base substrate is between the backside metal and the transistor, and the first metal material in a first via of the first plurality of vias can be electrically connected to a first contact of the plurality of contacts by one or more bonding materials.

In a second aspect, a semiconductor device can include a base substrate and a transistor connected to the base substrate. The base substrate can include a substrate layer comprising a semiconductor or insulator material, the substrate layer having a front side and a back side opposite the front side. The base substrate can further include a first plurality of vias that each extend through an entirety of the thickness of the substrate layer, a first metal material in each via of the first plurality of vias, a backside metal material overlying the back side of the substrate layer and contacting the first metal material in each via of the first plurality of vias, and an interconnect metal on the front side of the substrate layer. The transistor can include a III-N material structure. The III-N material structure can include a III-N barrier layer and a III-N channel layer on an N-face of the III-N barrier layer, wherein the III-N barrier layer has a larger bandgap than the III-N channel layer, as well as a 2DEG channel in the III-N channel layer adjacent to the interface between the III-N channel layer and the III-N barrier layer. The transistor can further include a plurality of contacts, the plurality of contacts including a source contact, a drain contact, and a gate contact. The source, gate, and drain contacts may be on an opposite side of the III-N channel layer from the III-N barrier layer, and the source and drain contacts may be electrically connected to the 2DEG channel. The transistor can further include a thermal contact that is thermally coupled to the III-N material structure and electrically isolated from the 2DEG channel. The transistor may be over the front side of the base substrate such that the substrate layer of the base substrate is between the backside metal and the transistor, and the first metal material in a first via of the first plurality of vias may be electrically connected to the thermal contact of the transistor.

In a third aspect, a semiconductor device can include a base substrate and a transistor connected to the base substrate. The base substrate can include a substrate layer comprising a semiconductor or insulator material, the substrate layer having a front side and a back side opposite the front side. The base substrate can further include a first plurality of vias that each extend through an entirety of the thickness of the substrate layer, a first metal material in each via of the first plurality of vias, a backside metal material overlying the back side of the substrate layer and contacting the first metal material in each via of the first plurality of vias, and an interconnect metal on the front side of the substrate layer. The transistor can include a III-N material structure. The III-N material structure can include a III-N barrier layer and a III-N channel layer on an N-face of the III-N barrier layer, wherein the III-N barrier layer has a larger bandgap than the III-N channel layer, as well as a 2DEG channel in the III-N channel layer adjacent to the interface between the III-N channel layer and the III-N barrier layer. The transistor can further include a plurality of contacts, the plurality of contacts including a source contact, a drain contact, and a gate contact. The source, gate, and drain contacts may be on an opposite side of the III-N channel layer from the III-N barrier layer, and the source and drain contacts may be electrically connected to the 2DEG channel. The transistor may be over the front side of the base substrate such that the substrate layer of the base substrate is between the backside metal and the transistor. A first end of an impedance element may be electrically connected to a first contact of the plurality of contacts, and a second end of the impedance element may be electrically connected to the first metal material.

In a fourth aspect, a semiconductor device can include a base substrate and a transistor connected to the base substrate. The base substrate can include a substrate layer comprising a semiconductor or insulator material, the substrate layer having a front side and a back side opposite the front side. The base substrate can further include a plurality of vias that each extend through an entirety of the thickness of the substrate layer, and a first metal material in each of the vias. The base substrate can also include a backside metal layer that is patterned on the back side of the substrate layer to form a first plurality of segments, wherein each segment of the first plurality of segments contacts the first metal material in at least one of the vias. The base substrate can also include a frontside metal layer that is patterned over the front side of the substrate layer to form a second plurality of segments, wherein each segment of the second plurality of segments contacts the first metal material in at least one of the vias. The transistor can include a III-N material structure. The III-N material structure can include a III-N barrier layer and a III-N channel layer on an N-face of the III-N barrier layer, wherein the III-N barrier layer has a larger bandgap than the III-N channel layer, as well as a 2DEG channel in the III-N channel layer adjacent to the interface between the III-N channel layer and the III-N barrier layer. The transistor can further include a plurality of contacts, the plurality of contacts including a source contact, a drain contact, and a gate contact. The source, gate, and drain contacts may be on an opposite side of the III-N channel layer from the III-N barrier layer, and the source and drain contacts may be electrically connected to the 2DEG channel. The transistor may be over the front side of the base substrate such that the substrate layer of the base substrate is between the backside metal and the transistor, and a first segment of the second plurality of segments may be electrically connected to a first contact of the plurality of contacts.

In a fifth aspect, a semiconductor device can include a base substrate and a structure. The base substrate can include a substrate layer comprising a semiconductor or insulator material, the substrate layer having a front side and a back side opposite the front side, and a frontside metal layer that is patterned over the front side of the substrate layer to form a first plurality of segments. The structure can include a semiconductor or insulator layer and a first metal layer over the semiconductor layer, wherein the first metal layer is patterned to form a second plurality of segments. Each segment of the first plurality of segments can be connected to at least one segment of the second plurality of segments by a bonding material. Additionally, the frontside metal layer, the first metal layer, and the bonding material can each be part of an inductive element.

Any of the semiconductor devices described herein can each include one or more of the following features, either alone or in combination with one another. At least one of the one or more bonding materials can include or be formed of gold, silver, copper, and indium containing compound, a tin containing compound, AuSn, AuSi, CuSn, AuGe, AlGe, AlSi, or a combination thereof. The one or more bonding materials may be directly between the first contact and the first metal material. The first contact may be the source contact. The substrate layer can include a material selected from the group consisting of silicon, gallium arsenide, silicon carbide, sapphire, germanium, indium phosphide, silicon oxide, and aluminum nitride. The base substrate can further include a second plurality of vias that each extend partially through the substrate layer without extending through an entirety of the thickness of the substrate layer. The base substrate can further include the first metal material in each via of the second plurality of vias. A second via of the second plurality of vias may be directly beneath a second contact of the plurality of contacts. A thermal conductivity of the first metal material may be greater than a thermal conductivity of the semiconductor or insulator material of the substrate layer. The base substrate may further include an isolation material within each via of the first plurality of vias, and optionally the isolation material may have a lower thermal conductivity than the semiconductor or insulator material of the substrate layer. The isolation material can be between the first metal material and the substrate layer. The isolation material may electrically isolate the first metal material from the substrate layer. The semiconductor device may further include a circuit element connected to the base substrate, wherein the circuit element is selected from the group consisting of a capacitor, an inductor, a transformer, a resistor, a waveguide, an antenna, an electrical resonator, an acoustic component, a piezoelectric component, a diode, and a silicon-based transistor. The first metal material can include or be formed of a material selected from the group consisting of copper, gold, aluminum, silver, and tungsten. The semiconductor device may be a circuit, and optionally a maximum frequency of operation of the transistor may be at least two times an operating frequency of the circuit. The semiconductor device may be a circuit, and optionally a total thickness of the one or more bonding materials may be less than 0.4% of a free space wavelength corresponding to the maximum operating frequency of the circuit. A total thickness of the one or more bonding materials may be less than 20 microns. The interconnect metal can directly contact the first metal material in the first via of the first plurality of vias. The interconnect metal can be between the source contact and the first metal material in the first via of the first plurality of vias. The plurality of contacts of the transistor can be between the III-N channel layer and the base substrate. At least a portion of the transistor can be contained within a device cell, and a separation between any 2 points within the device cell can be less than 15 percent of a free space wavelength of radiation at the highest frequency of operation of the semiconductor device. The backside metal layer, the frontside metal layer, and the first metal material in each of the vias can be part of an inductive element.

Any of the semiconductor devices described herein can include a second transistor that includes a second III-N barrier layer and a second III-N channel layer on an N-face of the second III-N barrier layer, wherein the second III-N barrier layer has a larger bandgap than the second III-N channel layer. The second transistor can also include a second 2DEG channel in the second III-N channel layer adjacent to the interface between the second III-N channel layer and the second III-N barrier layer. The second transistor can further include a second plurality of contacts, the second plurality of contacts comprising a second source contact, a second drain contact, and a second gate contact, wherein the second source contact, the second gate contact, and the second drain contact are each on an opposite side of the second III-N channel layer from the second III-N barrier layer, and the second source and second drain contacts are electrically connected to the second 2DEG channel. The second transistor can be connected to the base substrate at least in part by the one or more bonding materials, the one or more bonding materials further being directly between a second contact of the second plurality of contacts and the first metal material in a second via of the first plurality of vias.

In a sixth aspect, a method of forming a semiconductor device can include the steps of (i) providing a base substrate, and (ii) connecting a transistor to the base substrate. The base substrate can include a substrate layer comprising a semiconductor or insulator material, the substrate layer having a front side and a back side opposite the front side, a first plurality of vias that each extend through an entirety of the thickness of the substrate layer, a first metal material in each via of the first plurality of vias, a backside metal material overlying the back side of the substrate layer and contacting the first metal material in each via of the first plurality of vias, and an interconnect metal on the front side of the substrate layer. The transistor can include a III-N barrier layer and a III-N channel layer on an N-face of the III-N barrier layer, wherein the III-N barrier layer has a larger bandgap than the III-N channel layer. The transistor can also include a 2DEG channel in the III-N channel layer adjacent to the interface between the III-N channel layer and the III-N barrier layer. The transistor can further include a plurality of contacts, the plurality of contacts comprising a source contact, a drain contact, and a gate contact, wherein the source, gate, and drain contacts are on an opposite side of the III-N channel layer from the III-N barrier layer, and the source and drain contacts are electrically connected to the 2DEG channel. After connecting the transistor to the base substrate, the transistor can be over the front side of the base substrate such that the substrate layer of the base substrate is between the backside metal and the transistor. Furthermore, a first end of an impedance element can be electrically connected to a first contact of the plurality of contacts, and a second end of the impedance element can be electrically connected to the first metal material.

In a seventh aspect, a method of forming a semiconductor device can include the steps of (i) providing a base substrate, and (ii) connecting a transistor to the base substrate. The base substrate can include a substrate layer comprising a semiconductor or insulator material, the substrate layer having a front side and a back side opposite the front side, a first plurality of vias that each extend through an entirety of the thickness of the substrate layer, a first metal material in each via of the first plurality of vias, a backside metal material overlying the back side of the substrate layer and contacting the first metal material in each via of the first plurality of vias, and an interconnect metal on the front side of the substrate layer. The transistor can include a III-N barrier layer and a III-N channel layer on an N-face of the III-N barrier layer, wherein the III-N barrier layer has a larger bandgap than the III-N channel layer. The transistor can also include a 2DEG channel in the III-N channel layer adjacent to the interface between the III-N channel layer and the III-N barrier layer. The transistor can further include a plurality of contacts, the plurality of contacts comprising a source contact, a drain contact, and a gate contact, wherein the source, gate, and drain contacts are on an opposite side of the III-N channel layer from the III-N barrier layer, and the source and drain contacts are electrically connected to the 2DEG channel. After connecting the transistor to the base substrate, the transistor can be over the front side of the base substrate such that the substrate layer of the base substrate is between the backside metal and the transistor. Furthermore, the first metal material in a first via of the first plurality of vias can be electrically connected to a first contact of the plurality of contacts by one or more bonding materials.

For any of the methods described herein, the source contact can include a plurality of source fingers. Prior to connecting the transistor to the base substrate, the source fingers may be electrically isolated from one another, and after connecting the transistor to the base substrate the source fingers may be electrically connected to one another.

DESCRIPTION OF DRAWINGS

Like numbers in the drawings represent like elements.

DETAILED DESCRIPTION

Described herein are semiconductor devices in which one or more active devices such as transistors, diodes, and/or varactors formed of a first semiconductor material system (e.g., a III-V semiconductor system such as III-N materials) are integrated onto (e.g., connected to) a base substrate formed of a second semiconductor material system (e.g., silicon) that includes other circuit components. The base substrate can provide electrical connections between the active devices and the other circuit components, as well as dissipate heat generated during operation of the active devices. The configuration for the semiconductor devices can also minimize parasitic impedances and/or provide a precise impedance at each terminal of the active devices, thereby improving performance of the semiconductor devices. Because the cross-sectional area of the III-V material used to form the configuration is reduced relative to that of conventional III-V integrated circuits, the devices formed in this configuration may exhibit performance advantages provided by the III-V devices without many of the added costs associated with some of the other circuit components in conventional III-V integrated circuits.

Figure 1:
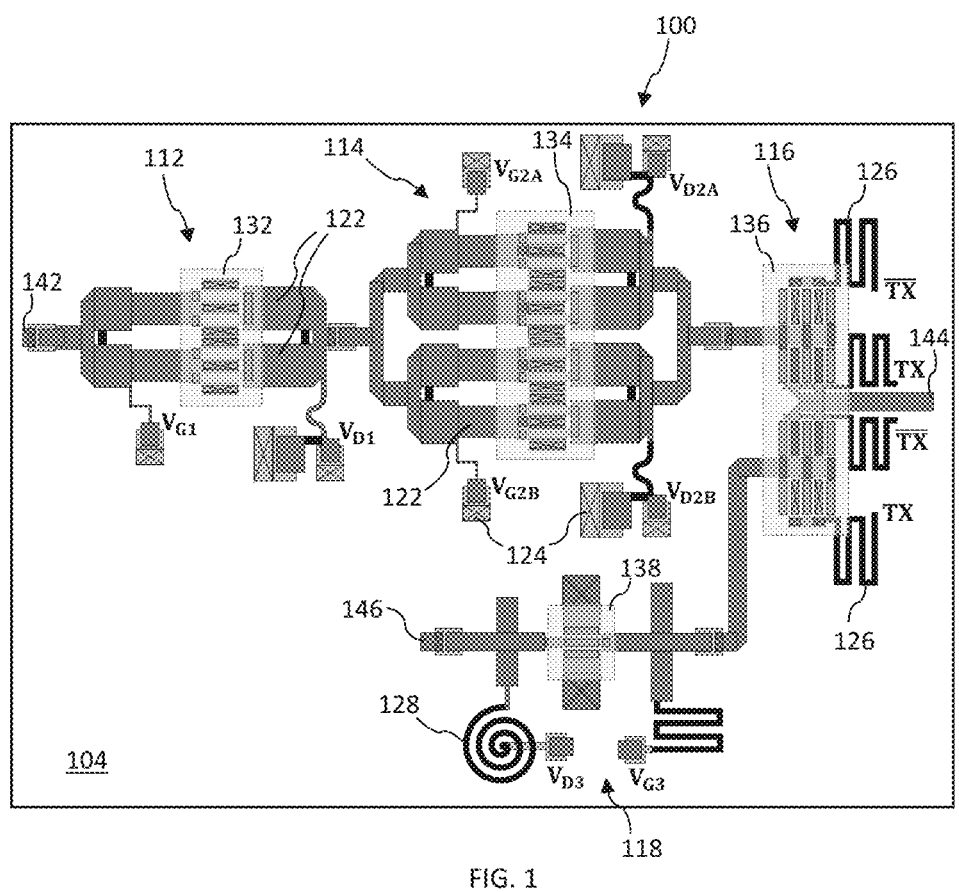
FIG. 1 is a schematic illustration of an example semiconductor device.

FIG. 1 is a plan view (i.e., top view) schematic illustration of an example semiconductor device 100 formed on a base substrate 104, where the semiconductor device 100 can be operated as a transmit-receive module (a common RF circuit).

The semiconductor device 100 includes several circuit sub-components, including a 2-stage power amplifier which has a first stage 112 and a second stage 114, a transmit-receive (T/R) switch 116, and a low-noise amplifier (LNA) 118. The semiconductor device 100 also includes a number of passive devices that are integrated onto or are part of the base substrate 104, including transmission lines 122, capacitors (e.g., metal-insulator-metal capacitors, also known as MIM capacitors) 124, thin film resistors 126, and an inductor 128. Semiconductor device 100 is further configured to receive a transmit input signal at node 142 and to send/receive signals to/from an antenna at node 144 and to send a receive output signal at node 146.

The semiconductor device 100 also includes active device chiplets 132, 134, 136, and 138, each of which includes one or more active devices such as transistors, diodes, and/or varactors. In many applications, the devices have very high power densities (e.g., greater than 250 mW per millimeter of gate periphery) during operation, and therefore may dissipate a substantial amount of heat. In the case of the transmit-receive module illustrated in FIG. 1, the chiplets 132, 134, 136, and 138 can each include one or more nitrogen-polar III-Nitride transistors, which are described in more detail below. The transistors of chiplet 132 are part of the first stage 112 of the power amplifier, the transistors of chiplet 134 are part of the second stage 114 of the power amplifier, the transistors of chiplet 136 are part of the T/R switch 116, and the transistors of chiplet 138 are part of the LNA 118. The transistors of chiplets 132, 134, 136, and 138 are each bonded to their respective circuit sub-component in a manner that provides electrical connections between the transistors and other components of semiconductor device 100 and also allows heat generated during operation of the transistors to be effectively dissipated, as further described below.

Although the chiplets 132, 134, 136, and 138 can each be provided as separate components that are each individually bonded to their respective circuit sub-component on base substrate 104, in some cases one or more of chiplets 132, 134, 136, and 138 may be very small and/or difficult to handle. Accordingly, two or more of the chiplets 132, 134, 136, and 138 may be provided as a single component (e.g., on a common substrate), and all of the transistors of the single-component chiplets can be bonded to their respective circuit sub-components.

As used herein, the terms III-Nitride or III-N materials, layers, devices, etc., refer to a material or device comprised of a compound semiconductor material according to the stoichiometric formula $Sc_vB_wAl_xIn_yGa_zN_a(D)_b$, where v+w+x+y+z is about 1, $0 \leq v \leq 1$, $0 \leq w \leq 1$, $0 \leq x \leq 1$, $0 \leq y \leq 1$, $0 \leq z \leq 1$, a+b is about 1, $0.9 < a \leq 1$, $0 \leq b < 0.1$, and (D) is any group-V element other than nitrogen. In a III-Nitride or III-N device, such as a high electron mobility transistor (HEMT), the conductive channel can be partially or entirely contained within a III-N material layer.

Figure 2A:
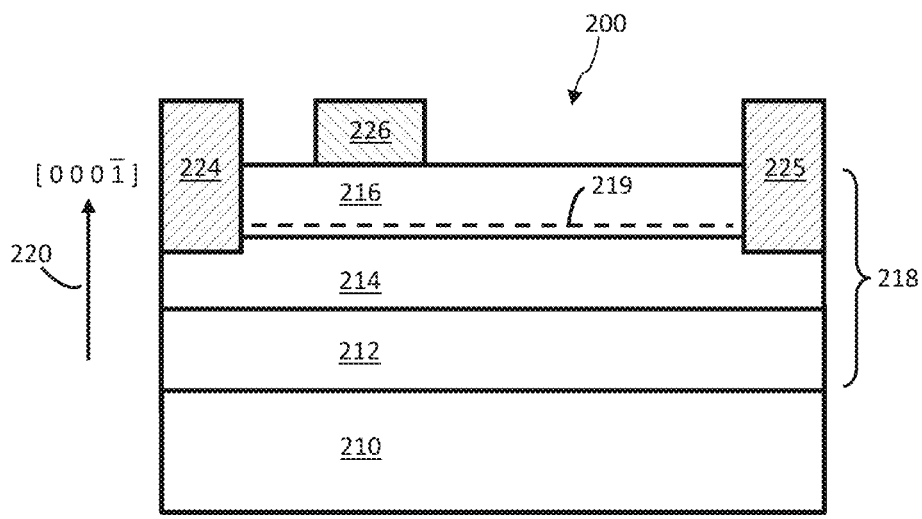
FIGS. 2A and 2B are cross-sectional views of example N-polar III-N transistors.

A cross-sectional view of an example nitrogen-polar (N-polar) III-N transistor 200 that can be used as the transistor in chiplets 132, 134, 136, and 138 is shown in FIG. 2A. Transistor 200, which is configured as a HEMT, includes a III-N material structure 218, grown on a suitable substrate 210, which can for example be silicon, silicon carbide, sapphire, A1N, or GaN. The III-N material structure includes a first III-N layer 212 on the substrate 210, a III-N barrier layer 214 on the first III-N layer 212, and a III-N channel layer 216 on the III-N barrier layer 214. The first III-N layer 212 can, for example, be formed of or include GaN, and can serve as a buffer layer in order to enable the growth of high quality III-N active device layers thereover. The III-N barrier layer 214 can, for example, be formed of or include $Al_xGa_{1-x}N$. The bandgap of the III-N barrier layer 214 can be larger than that of the first III-N layer 212. The III-N channel layer 216 can, for example, be GaN. The III-N channel layer 216 has a different composition than the III-N barrier layer 214, the bandgap of the III-N barrier layer 214 is larger than that of the III-N channel layer 216, and the thicknesses of layers 214 and 216 are selected such that a two-dimensional electron gas (2DEG) channel 219 (indicated by the dashed line in FIG. 2) is induced in the III-N channel layer 216 adjacent to the interface between III-N barrier layer 214 and III-N channel layer 216.

Transistor 200 further includes a source contact 224, a drain contact 225, and a gate contact 226, with the source and drain contacts 224 and 225, respectively, being electrically connected to the 2DEG channel 219. As used herein, two or more contacts or other items such as conductive layers or components are said to be "electrically connected" if they are connected by a material which is sufficiently conducting to ensure that the electric potential at each of the contacts or other items is intended to be the same, i.e., is about the same, at all times under any bias conditions.

III-N layers 212, 214, and 216 are N-polar III-N layers, oriented as indicated by arrow 220 in the [0 0 0 $\bar{1}$] direction. Accordingly, III-N channel layer 216 is on an N-face of the III-N barrier layer 214, and the source, drain, and gate contacts 224-226, respectively, are over the N-face of the III-N material structure 218 and on an opposite side of the III-N channel layer 216 from the III-N barrier layer 214. In some implementations, it may be preferable that the first III-N layer 212 be at least 5 microns thick (e.g., at least 7 microns thick or at least 10 microns thick). For example, if substrate 210 is electrically conductive, it may be desirable for the first III-N layer 212 to be semi-insulating and at least 10 microns thick in order to electrically decouple the substrate 210 from the 2DEG channel 219. Optionally, the substrate 210 can be removed after forming III-N layers 212, 214, and 216, such that substrate 210 is not included in the final transistor structure. Furthermore, some or all of any III-N layers that underly the III-N barrier layer 214 (e.g., III-N layer 212) can also optionally be removed after formation of III-N layers 212, 214, and 216.

Figure 2B:
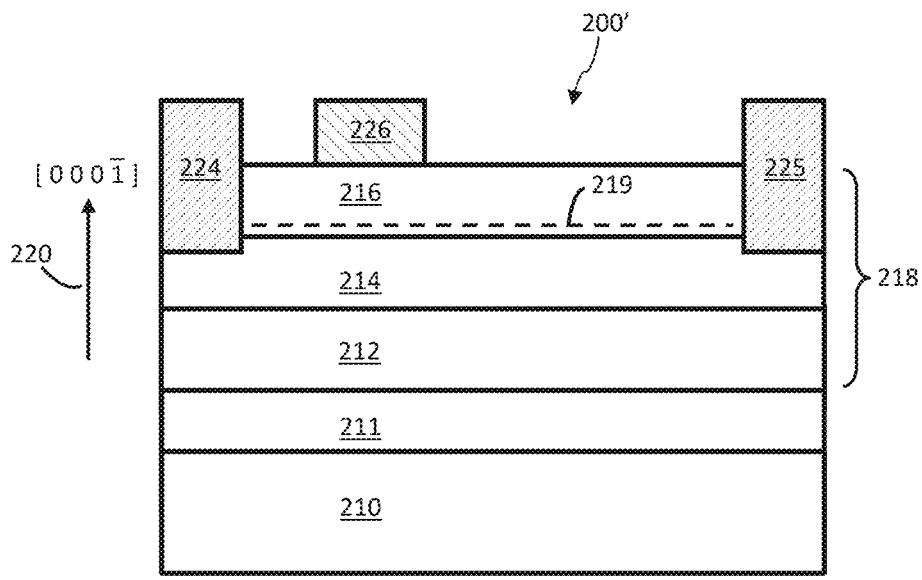

FIG. 2B shows another implementation of a nitrogen-polar (N-polar) III-N transistor 200' that is similar to transistor 200 of FIG. 2A but further includes a III-N transition layer 211 between the substrate 210 and the N-polar III-N material structure 218. In some cases, it can be difficult to grow high quality N-polar III-N layers directly on a foreign substrate (e.g., a substrate that is not formed of a III-N material). In transistor 200' of FIG. 2B, this problem is addressed by first growing a III-N transition layer 211 that is initially grown as a III-polar layer but is inverted to an N-polar layer during growth of the layer, for example by doping with magnesium. That is, the initial portion of III-N transition layer 211 (i.e., the portion proximal to substrate 210) is formed as a III-polar layer, and after this initial portion is formed the growth conditions are adjusted such that the portion of layer 211 that is above this initial portion inverts and is formed having a nitrogen-polar orientation. Similar to transistor 200 of FIG. 2A, the substrate can optionally be removed, and at least a portion of the III-N layers that underly the III-N barrier layer 214 (e.g., III-N layers 211 and 212) can also optionally be removed after formation of III-N layers 212, 214, and 216.

Figure 3:
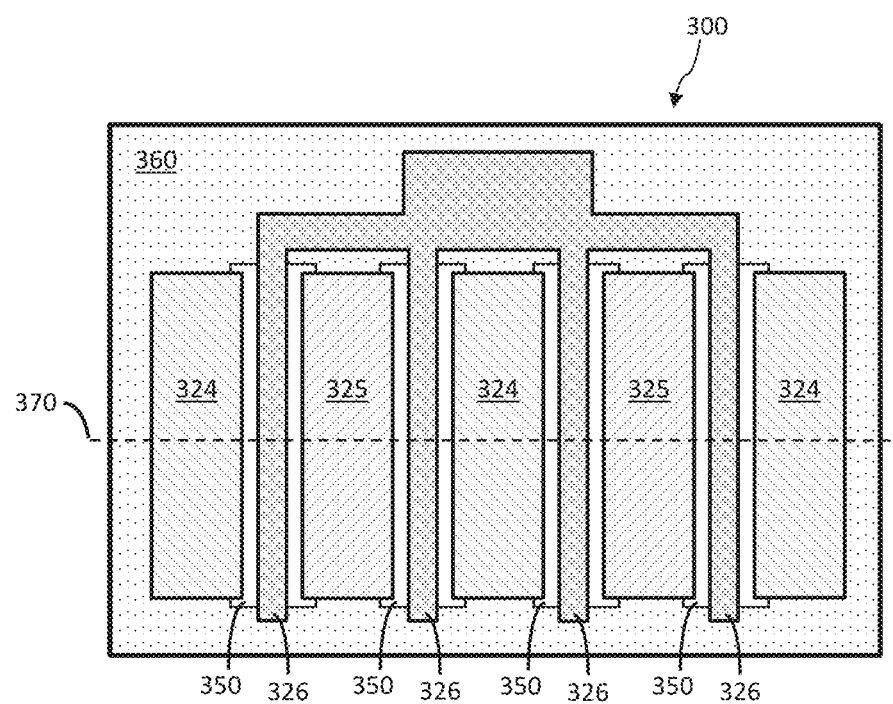
FIG. 3 is a plan view of an example N-polar III-N transistor structure.

FIG. 3 is a plan view of an N-polar III-N transistor structure 300 that is similar to transistor 200 of FIG. 2 but implemented as a multi-finger device. The source contact of transistor structure 300 (corresponding to source contact 224 of transistor 200) is implemented as a plurality of source fingers 324. The drain contact of transistor structure 300 (corresponding to drain contact 225 of transistor 200) is implemented as a plurality of drain fingers 325. The gate contact of transistor structure 300 (corresponding to gate contact 226 of transistor 200) is implemented as a plurality of gate fingers 326, where each gate finger 326 is between one of the source fingers 324 and one of the drain fingers 325, as shown. The gate fingers 326 are primarily over the active regions 350 of transistor structure 300, and the metal that connects each of the gate fingers 326 is over the non-active region 360 of transistor structure 300. In the active regions 350, the III-N layers of transistor structure 300 are the same as III-N material structure 218 of transistor 200 in FIGS. 2, and 2DEG channel 219 is present in this region. In the non-active region 360, the III-N layers are modified (e.g., by ion implantation or by etching at least partially through the III-N material structure 218) to eliminate the 2DEG channel 219 or to otherwise render all of the material in the non-active region 360 as non-conductive. The source fingers 324 may be configured such that they are electrically isolated from one another (i.e., not electrically connected to one another), and the drain fingers may also be configured such that they are electrically isolated from one another (i.e., not electrically connected to one another) in the transistor structure 300, as shown. However, the source fingers 324 can become electrically connected to one another when III-N transistor structure 300 is connected to base substrate 104 in FIG. 1 via interconnect metals that are on the base substrate, as further described below. Similarly, the drain fingers 325 can also become electrically connected to one another when III-N transistor structure 300 is connected to base substrate 104 in FIG. 1 via interconnect metals that are on the base substrate. In some implementations, prior to connecting the transistor structure 300 to base substrate 104, the source fingers 324 are electrically connected to one another but the drain fingers 325 are electrically isolated from one another. In other implementations, prior to connecting the transistor structure 300 to base substrate 104, the drain fingers 325 are electrically connected to one another but the source fingers 324 are electrically isolated from one another.

In some implementations, at least a portion of the III-N transistor structure 300 is contained within a device cell, and a separation between any 2 points within the device cell is less than 15 percent of a free space wavelength of radiation at the highest frequency of operation of the semiconductor device. As used herein, the term "device cell" refers to a semiconductor device with a collection of electrodes of two or more types, e.g. gate, source and drain for a field-effect transistor, or anode and cathode for a diode, where each electrode of a given type is connected in parallel through conductive connections. There may be multiple active semiconductor regions which are accessed by these electrodes. The device cell is further constrained to be electrically small so that the phase of a continuous-wave sinusoidal signal varies by no more than 10% of a period between all of the parallel connected electrodes. At a minimum, this requires that that the physical extent of the device cell be contained within a region on the surface of the wafer wherein no two points on the perimeter of the cell exceed a distance corresponding to wavelength of free space divided by 34 at the maximum frequency of operation . An electrode may also extend out of what is considered to be the device cell, it is understood that the key feature of an ohmic contact for example is the portion within three transfer lengths of the current carrying edge of an electrode, but the electrode may physically extend any distance beyond this. A number of device cells may be further interconnected in parallel within a circuit.

Figure 4:
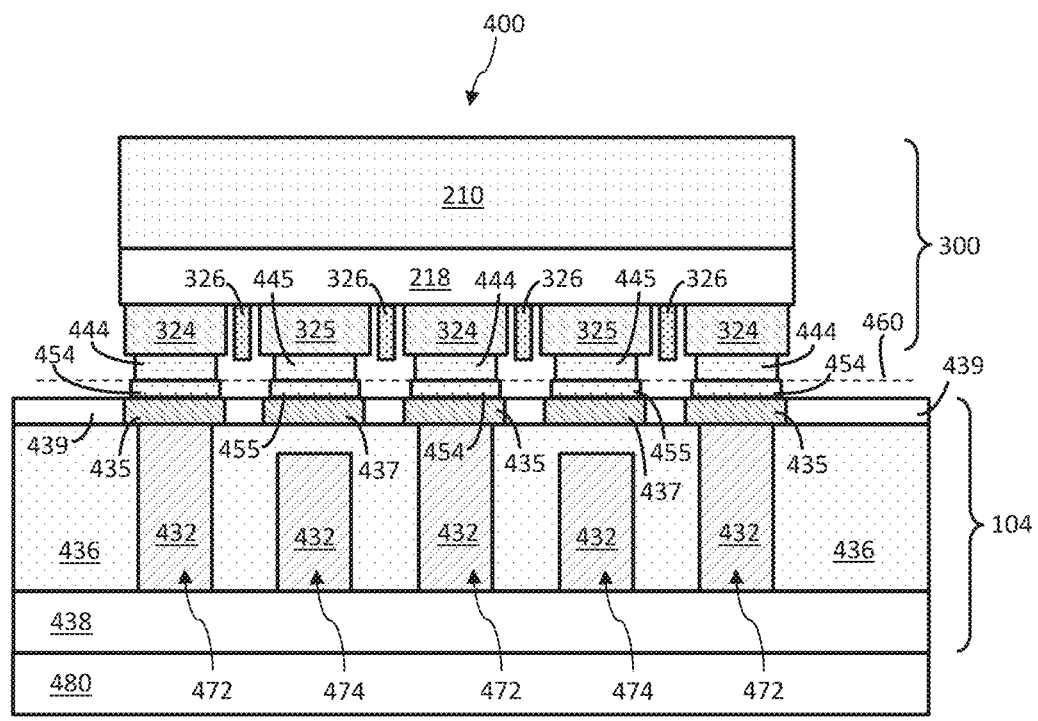
FIG. 4 is a cross-sectional view of an implementation of the semiconductor device of FIG. 1.

FIG. 4 is a cross-sectional view 400 of an implementation of semiconductor device 100 of FIG. 1 in which transistor structure 300 of FIG. 3 is used as each of the transistors in chiplets 132 and 134. Specifically, FIG. 4 illustrates the connections between transistor structure 300 and the underlying base substrate 104 along dashed line 370 in FIG. 3, as well as illustrating additional features of the base substrate 104. As seen in FIG. 4, base substrate 104 includes a substrate layer 436 that includes or is formed of a semiconductor or insulator material such as silicon, gallium arsenide, silicon carbide, sapphire, germanium, indium phosphide, silicon oxide, and aluminum nitride. Substrate layer 436 has a front side adjacent to transistor structure 300 and a back side opposite the front side. Substrate layer 436 includes a first plurality of vias 472 formed therein, where each via 472 of the first plurality of vias extends through an entirety of the thickness of the substrate layer 436 (i.e., from the front side to the back side). Each via 472 of the first plurality of vias has a first metal material 432 therein. The first metal material can include or be formed of a material selected from the group consisting of copper, gold, aluminum, silver, and tungsten. Base substrate 104 further includes a backside metal material 438 overlying the back side of substrate layer 436 and contacting the first metal material 432 in each via 472 of the first plurality of vias. Base substrate 104 also includes an interconnect metal 435/437 on the front side of the substrate layer 436, with interconnect metal 435 directly contacting the first metal material 432 in each via 472 of the first plurality of vias. Interconnect metal 435 can electrically connect each of the source fingers 324 to one another, and interconnect metal 437 can electrically connect each of the drain fingers to one another when transistor structure 300 is connected (e.g., bonded) to base substrate 104. The interconnect metals 435/437 can also form electrical connections between the contacts of the transistor structure 300 and other components of semiconductor device 100 when transistor structure 300 is connected (e.g., bonded) to base substrate 104. A dielectric material 439 is optionally included on the front side of substrate layer 436.

Figure 5:
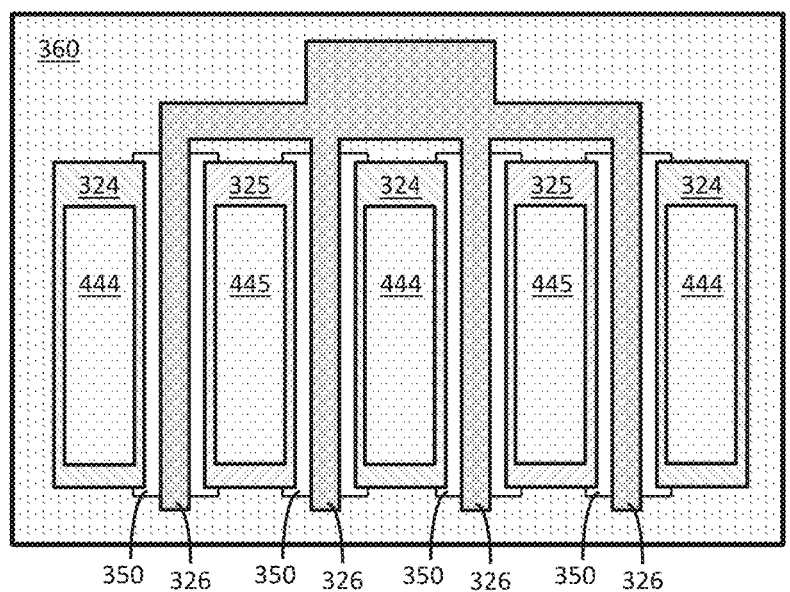
FIG. 5 is a plan view of an N-polar III-N transistor structure having bonding material deposited over source and drain contacts.

As seen in FIG. 4, transistor structure 300 is connected to the base substrate 104 in a configuration in which the plurality of contacts 324-326 of the transistor structure 300 is between the III-N channel layer of material structure 218 and the base substrate 104. Transistor structure 300 can be connected to base substrate 104 by using the following process. Prior to being connected, a first bonding material 444/445 is deposited on portions of the source and drain contacts 324 and 325, respectively, of transistor structure 300, as seen in FIG. 5. As shown in FIGS. 4 and 5, portions 444 of the first bonding material are deposited on portions of the source contact 324, and portions 445 of the first bonding material are deposited on portions of the drain contact 325. A second bonding material 454/455 (shown in FIG. 4) is deposited over portions of the base substrate 104 in a pattern which mirrors that of the first bonding material 444/445, with the position of portions 454 of the second bonding material corresponding to the position of portions 444 of the first bonding material, and the position of portions 455 of the second bonding material corresponding to the position of portions 445 of the first bonding material. Portions 454 of the second bonding material can directly contact interconnect metal 435, and portions 455 of the second bonding material can directly contact interconnect metal 437. Transistor structure 300 can then be placed on the front side of base substrate 104 in an orientation in which the substrate layer 436 is between the backside metal 438 and the transistor 300, with portions 444 of the first bonding material directly contacting portions 454 of the second bonding material, and portions 445 of the first bonding material directly contacting portions 455 of the second bonding material. As seen in FIG. 4, in this configuration bonding materials 444/454 are directly between the source contact 324 and the first metal material 432 in each via 472 of the first plurality of vias, and interconnect metal 435 is between the source contact 324 and the first metal material 432 in each via 472 of the first plurality of vias. The entire semiconductor device 100 can then be subjected to heat and/or pressure in order to cause the bonding materials to form an electrical and thermal connection between the source/drain contacts 324/325 and their corresponding interconnect metals 435/437. Because interconnect metal 435 is directly connected (and electrically connected) to the first metal material 432 in each via 472 of the first plurality of vias, after the thermal bonding process is completed, the first metal material 432 in each via 472 of the first plurality of vias is electrically connected to the source contact 324 by bonding materials 444 and 454.

Bonding materials 444/445 and 454/455 can each be formed of the same material or can be different materials. For example, any of the bonding materials 444/445 or 454/455 can include or be formed of gold, silver, copper, and indium containing compound, a tin containing compound, AuSn, AuSi, CuSn, AuGe, AlGe, AlSi, or a combination thereof. In some cases, bonding material 444/445 is applied to the transistor structure 300, but bonding material 454/455 is not applied to the base substrate 104 and is therefore omitted from semiconductor device 100, such that only a single bonding material is used in device 100. In other cases, bonding material 454/455 is applied to the base substrate 104, but bonding material 444/445 is not applied to the transistor structure 300 and is therefore omitted from semiconductor device 100, such that only a single bonding material is used in device 100.

The first metal material 432 in each via 472 of the first plurality of vias shown in FIG. 4 can serve a number of purposes. First, it provides an electrically conductive path between the source contact (fingers) 324 of transistor 300 and backside metal material 438, thereby causing the source fingers 324 to be electrically connected to one another and also allowing voltages (e.g., ground voltage) to be applied to the source contact 324 by way of the backside metal material 438. Second, it provides a thermally conductive path for heat generated by transistor 300 during operation to be dissipated, e.g., by transferring the heat away from transistor 300 and into backside metal material 438. In order to effectively transfer the heat away from transistor 300, the composition of first metal material 432 can be selected such that a thermal conductivity of the first metal material 432 is greater than a thermal conductivity of the semiconductor or insulator material of the substrate layer 436. To further improve thermal management in semiconductor device 100, the device 100 can also optionally be mounted to a metal plate 480 which directly contacts the backside metal material 438, as shown in FIG. 4. Metal plate 480 can serve as both a ground plate and a heat sink.

To further improve dissipation of heat away from transistor 300, base substrate 104 can further include a second plurality of vias 474, with each via 474 of the second plurality of vias also including the first metal material 432 therein. As seen in FIG. 4, each via 474 of the second plurality of vias can be placed directly beneath one of the contacts 324-326 for which vias 472 of the first plurality of vias are not beneath. For example, for the configuration 400 shown in FIG. 4, each via 472 of the first plurality of vias is directly beneath a source finger 324, and each via 474 of the second plurality of vias is directly beneath a drain finger 325. Each via 474 also extends to the back side of substrate layer 436, such that the first metal material 436 in the via 474 of the second plurality of vias contacts the backside metal material 438. However, in order to prevent the source and drain contacts 324 and 325, respectively, from being shorted (i.e., electrically connected) to one another, the first metal material 432 in vias 474 of the second plurality of vias should be electrically isolated from the drain contact 325. Accordingly, as seen in FIG. 4, each via 474 of the second plurality of vias only extends partially through the substrate layer 436, without extending through an entirety of the thickness of the substrate layer 436. As such, a portion of the substrate layer 436 remains between vias 474 and interconnect metal 437.

Figure 6:
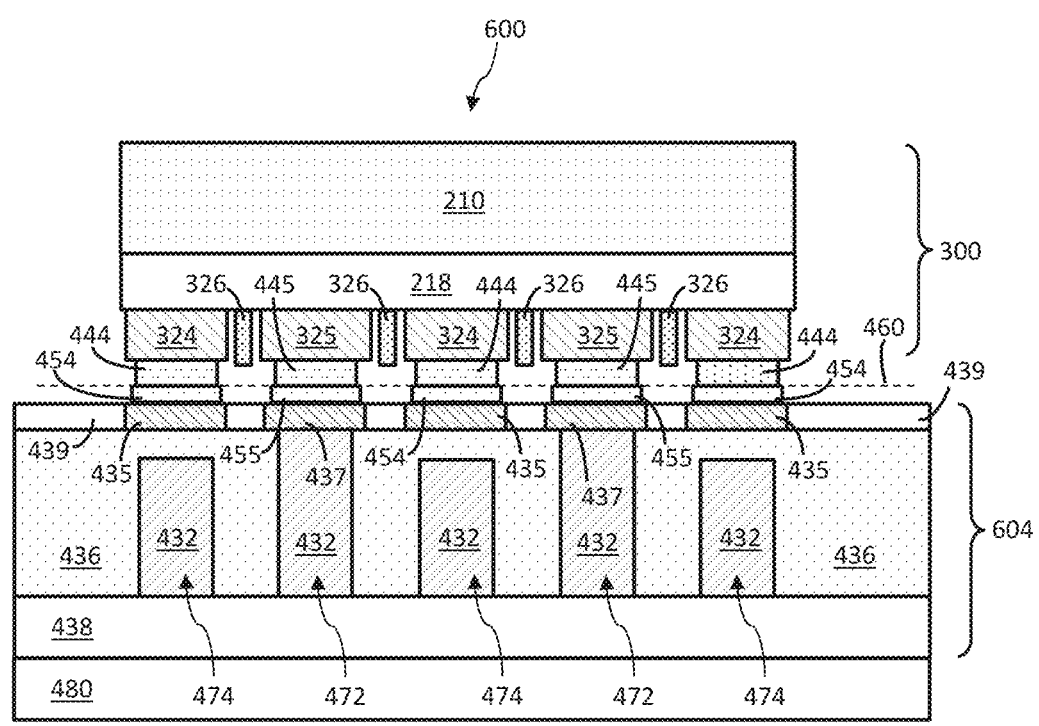
FIGS. 6-7 are cross-sectional views of other implementations of the semiconductor device of FIG. 1.

Because the first metal material 432 in each via 472 of the first plurality of vias is electrically connected to both the backside metal material 438 and to the source contact 324, the source contact can be held at ground voltage by mounting the semiconductor device 100 to a ground plate 480 with the ground plate directly contacting the backside metal material 438, as shown in FIG. 4. However, in some cases it may be preferable to have the drain contact 325, and not the source contact 324, contacting the backside metal material 438. FIG. 6 shows an alternative implementation 600 of semiconductor device 100 in which transistor 300 is bonded to a base substrate 604. Base substrate 604 is similar to base substrate 104 in FIG. 4, but is configured with the vias 472 of the first plurality of vias (i.e., the vias that extend through the entire thickness of substrate layer 436) below the drain fingers (i.e., the drain contact) 325, and with the vias 474 of the second plurality of vias below the source fingers (i.e., the source contact) 324. Accordingly, when transistor 300 is connected (e.g., bonded) to base substrate 604, the drain contact 325 of transistor 300 is electrically connected to the first metal material 432 in the first plurality of vias 472, and the vias 474 of the second plurality of vias are beneath the source contact 324.

Figure 7:
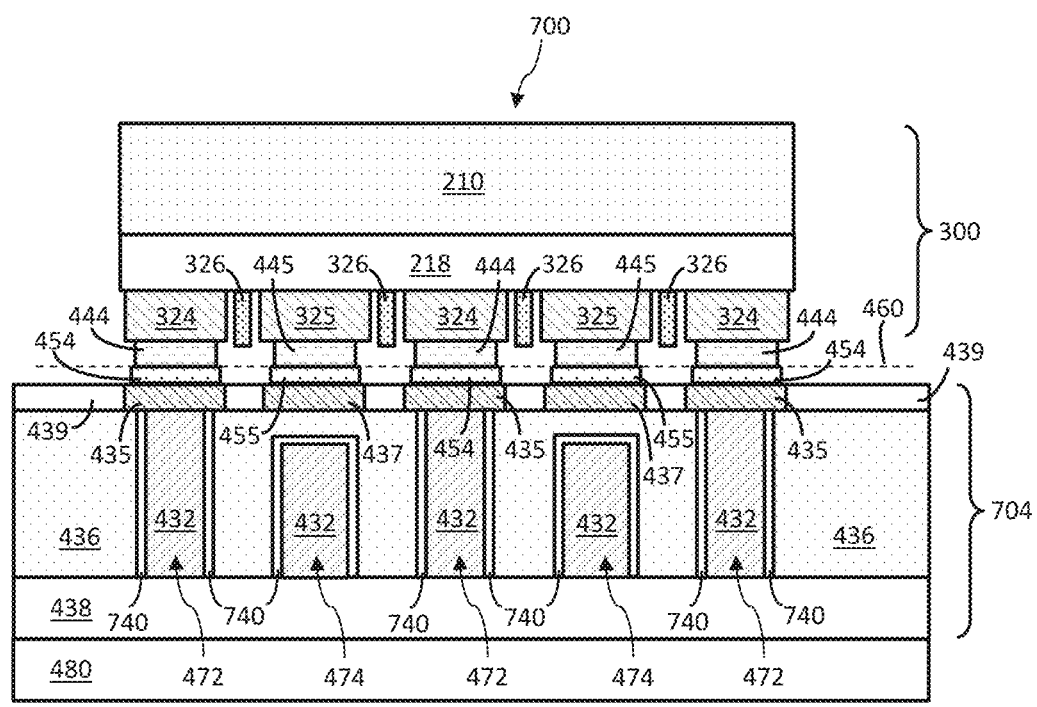

In some cases, it may be desirable to electrically isolate the first metal material 432 in vias 472 and 474 from the substrate layer 436 in order to suppress leakage currents through substrate layer 436. Accordingly, FIG. 7 is a cross-sectional view of a portion of semiconductor device 100 of FIG. 1 showing an implementation 700 in which transistor 300 is connected (e.g., bonded) to a base substrate 704. Base substrate 704 is similar to base substrate 104 shown in FIG. 4, but further includes an isolation material 740 in vias 472 and 474 between first metal material 432 and substrate layer 436. The isolation material 740 electrically isolates the first metal material 432 from the substrate layer 436. The isolation material 740 can have a higher thermal conductivity than the semiconductor or insulator material of substrate layer 436, which can further improve heat dissipation from the transistor 300. However, many materials that provide sufficient electrical isolation also have lower thermal conductivities. Accordingly, the isolation material 740 may have a lower thermal conductivity than the semiconductor or insulator material of the substrate layer 436.

Figure 8A:
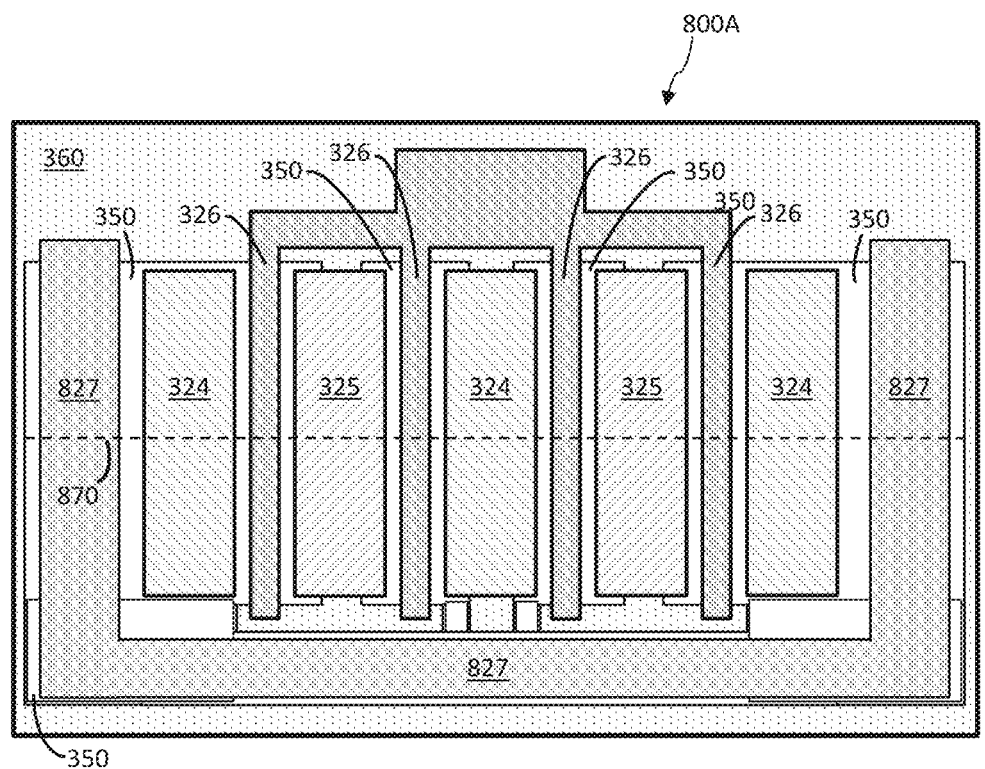
FIGS. 8A and 8B are plan views of N-polar III-N transistor structures that include a thermal contact.
Figure 8B:
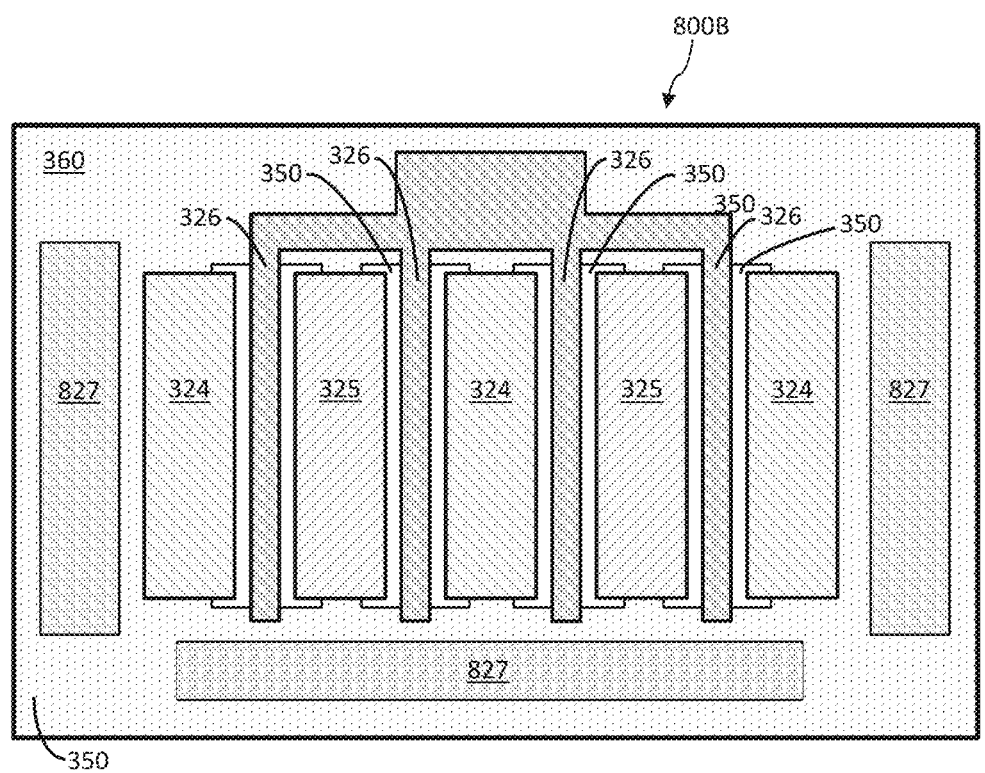
Figure 9:
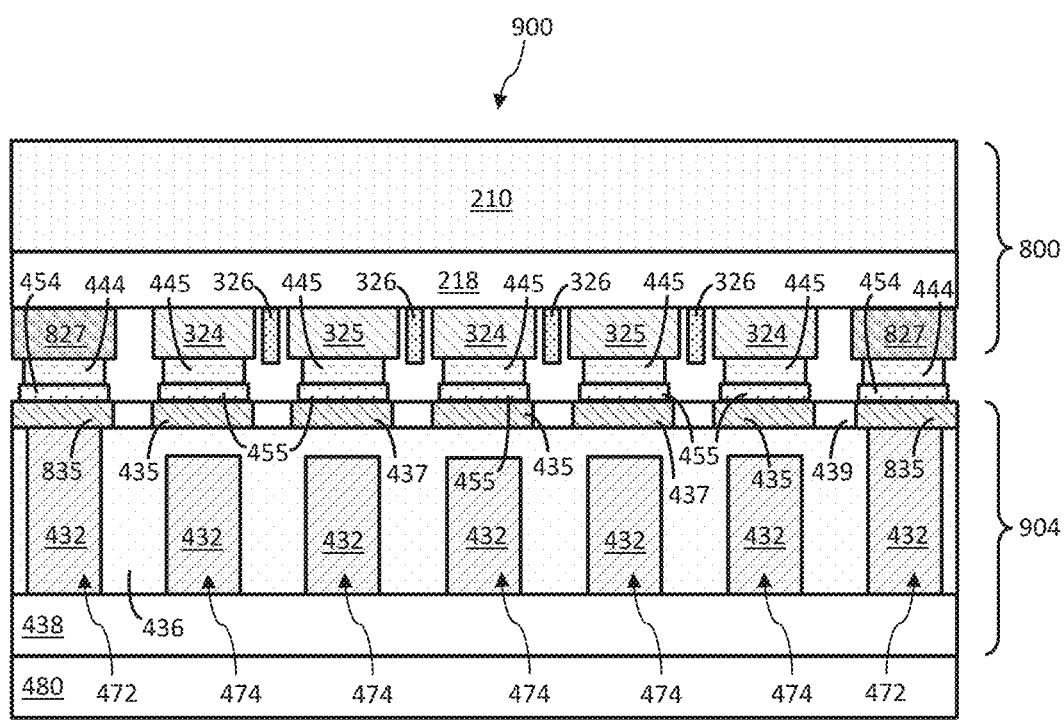
FIG. 9 is a cross-sectional view of an implementation of a semiconductor device including the transistor structure of FIG. 8A connected to a base substrate.

In some implementations of semiconductor device 100, it is preferable that the source, drain, and gate contacts 324-326, respectively, are all electrically isolated from (i.e., not electrically connected to) the backside metal material 438. However, in such a structure it can be difficult to sufficiently dissipate heat away from the N-polar III-N transistors during operation. FIGS. 8A and 8B show implementations of an N-polar III-N transistor structure 800A and 800B, respectively, which are similar to transistor structure 300 of FIG. 3, but further includes a thermal contact 827 that is electrically isolated from the 2DEG channel (2DEG 219 shown in FIG. 2), but is thermally coupled to the III-N material structure in the transistor structure's active and/or non-active regions 350 and 360, respectively. In transistor structure 800A, the thermal contact is partially on the material in the active region 350 and partially on the material in the non-active region 370. In transistor structure 800B, the thermal contact is divided into multiple regions and is entirely on the material in the non-active region 370. Transistor structures 800A and 800B can be connected to a base substrate 904 in the configuration 900 shown in FIG. 9 (transistor structure 800A is shown in FIG. 9) in order to allow for sufficient dissipation of heat during operation. As seen in FIG. 9, which is a cross-sectional view along dashed line 870 in FIG. 8A of the semiconductor device when transistor structure 800 is bonded to base substrate 904, base substrate 904 is similar to base structure 104 in FIG. 4, but is configured with the vias 472 of the first plurality of vias (i.e., the vias that extend through the entire thickness of substrate layer 436) below the thermal contact 827, and with the vias 474 of the second plurality of vias below the source and drain contacts 324 and 325, respectively. Accordingly, when transistor 300 is connected (e.g., bonded) to base substrate 604, the thermal contact 827 of transistor structure 800 is electrically connected to the first metal material 432 in the first plurality of vias 472, and the vias 474 are below the source and drain contacts 324 and 325, respectively. In this configuration, a substantial amount of heat generated in transistor structure 800 is transferred to backside metal 438 through the thermal contact 827, interconnected metal 835, and the first metal material 432 in the first plurality of vias 472. Additional heat is also transferred to backside metal 438 through the source and drain contacts 324 and 325, respectively, and through the first metal material 432 in the second plurality of vias 474.

Although FIG. 1 shows semiconductor device 100 configured as a transmit-receive module, other types of devices and circuits for different applications can be formed with III-N N-polar transistors bonded to a base substrate using the process described above. For example, devices and circuits that may be formed with III-N N-polar transistors bonded to a base substrate using the structures and processes described herein can include a power amplifier (e.g., a Class A power amplifier, a class B power amplifier, a class C power amplifier, an outphasing power amplifier, a Doherty power amplifier, a switchmode power amplifier such as a Class D, E, F, or inverse class F power amplifier, a stacked power amplifier, or an envelope tracking power amplifier), a low noise amplifier, a buffer or drive amplifier, a distributed amplifier, a transimpedance amplifier, an operational amplifier, a laser or light emitting diode driver, a piezoelectric driver, an analog predistorter, a switch such as a single pole single throw switch, a single pole double throw switch, other switch implementations with one or more poles and one or more throws, a discrete transistor, a cascode amplifier, a Darlington pair amplifier, a differential pair, a mixer, a frequency multiplier, a frequency divider, a phase detector, a phase locked loop, an oscillator, a voltage-controlled oscillator, a variable gain amplifier, a variable attenuator, a phase shifter, a modulator, a vector modulator, a voltage regulator, a pulse modulator, a pulse generator, a power detector, a time delay, a coupler, an isolator, a circulator, a filter, a limiter, and any of the above circuits in configurations with either differential or single-ended inputs and differential or single-ended outputs, a linear voltage regulator, a half bridge, a full bridge, a rectifier, a switching power converter such as but not limited to a buck converter, a boost converter, a buck-boost converter, a Cuk converter, a single-ended primary-inductor converter, a flyback converter, a forward converter, a push-pull converter, a half-bridge or full-bridge converter, or an envelope tracking power supply. Many of these other types of devices and circuits can include other circuit components, either in addition to or in place of the components described above for semiconductor device 100. These other components can include, for example, a capacitor, an inductor, a transformer, a resistor, a waveguide, an antenna, an electrical resonator, an acoustic component, a piezoelectric component, a diode, a silicon-based transistor, or a combination thereof.

When semiconductor device 100 is configured as a circuit (e.g., an RF circuit), various components and features can be configured to optimize the circuit performance. In particular, for operation at high power and high frequencies, various features and design elements can play an important role in circuit performance. Accordingly, transistor 300 can be configured such that its maximum frequency of operation is at least two times (e.g., at least 2.5 times, at least 3 times, at least 4 times, or at least 5 times) the operating frequency of the circuit. For high frequency amplifiers the most relevant maximum frequency of operation is the maximum oscillation frequency, and for switches the most relevant maximum frequency of operation is the switch cutoff frequency. There are also circuits such as frequency multipliers where there is no clearly defined maximum frequency of operation. Furthermore, in order to minimize parasitic impedances at the source and gate terminals of transistor 300, the total thickness of the bonding materials 444/454 or 445/455 can be less than 0.4% (e.g., less than 0.3% or less than 0.2%) of the free space wavelength corresponding to the maximum operating frequency of the circuit. For example, the total thickness of the bonding materials 444/454 or 445/455 can be less than 30 microns, less than 25 microns, less than 20 microns, less than 15 microns, or less than 10 microns.

As used herein, the term "maximum operating frequency" refers to the maximum frequency where an intentional voltage, current, or power of a signal exists. In applications with bandwidth-limited signals, such as most digitally modulated communication, this is taken to be the upper frequency limit of the signal's channel. In applications without clearly defined upper frequency limits, such as when the signal is a frequency modulated analog signals, or a pulse train, an upper limit will typically be taken as the highest frequency below which 99% of the intentional signal power is contained, excluding any direct current components of power. The harmonics of a signal frequency are typically excluded from the maximum operating frequency except in applications where a harmonic component of a signal is used as an output, as in the case of a frequency multiplier.

In some implementations of semiconductor device 100, it is preferable to add precise impedances at the source, drain, and or gate contacts 324-326, respectively, to provide improved impedance matching in various RF circuit applications. For example, in a low noise amplifier with a common-source connected HEMT transistor, it can be desirable to add a small inductive impedance between the HEMT source and circuit ground, while also supplying gain and low noise matching impedances to the drain and gate, respectively. When the device terminals are also used as the primary points for heat transfer into the base substrate, in many cases at least one terminal will be connected directly to the backside metal of the base substrate (e.g. source contact 324 in implementations 400 and 700, and drain contact 325 in implementation 600) by way of a metal material 432 in a plurality of vias 472. To control the series inductance between the backside metal 438 and the contact that is connected to metal material 432 in vias 472, the size (e.g., average diameter) and number of vias can be adjusted. However, the range of impedance values that may be obtained by this method may be limited (the magnitude of the impedance of an inductor is equal to the product of the inductance and the frequency of a current flowing through the inductor). For example, the product of the inductance and the gate width of a transistor may be limited to a range of 0.01 to 100 pH-mm (where the gate width of the transistor refers to the dimension of the gate that is perpendicular to the gate length), which can therefore limit the range of impedance values that may be obtained. Another approach is to pattern the backside metal 438 to include various passive circuit elements rather than providing backside metal 438 as a uniform ground plane. However, this approach may be less desirable when mounting the semiconductor device to a ground plate 480. Yet another approach is to implement the structure shown in FIG. 9 with impedance elements (e.g., metal strips having a desired impedance) in series with the interconnect metals 435 and 437 that are connected to the source and drain contacts 324 and 325, respectively.

Figure 10:
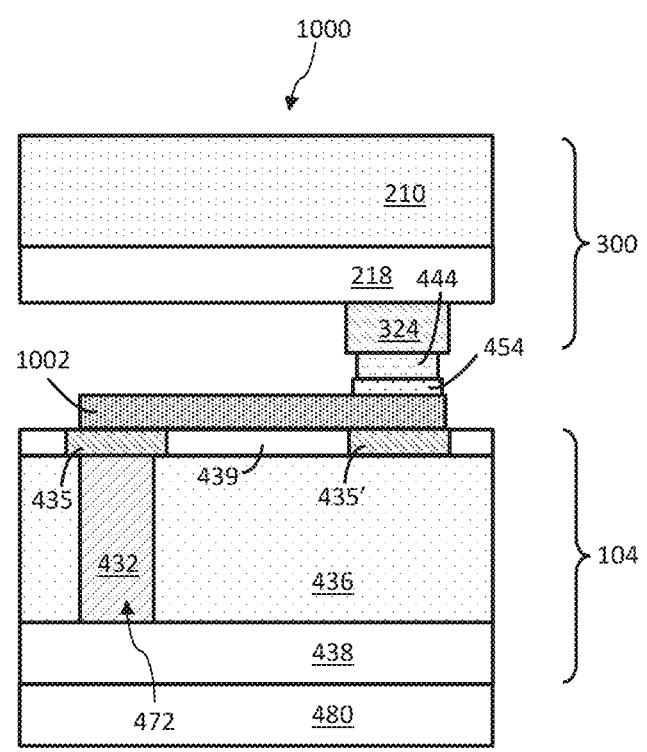
FIG. 10 is a cross-sectional view of an implementation of a semiconductor device that includes an impedance element between a contact of a transistor structure and an interconnect metal of a base substrate.

Another approach is to include an impedance element between the source contact 324 and the source interconnect metal 435, and/or between the drain contact 325 and the drain interconnect metal 437. The impedance element can, for example, be a metal strip deposited over the dielectric material 439 (shown in FIG. 4) that is on the front side of substrate layer 436. FIG. 10 is a cross-sectional view of the source bond for a configuration 1000 of a semiconductor device which is similar to configuration 400 of FIG. 4 but further includes an impedance element 1002 between source contact 324 and source interconnect metal 435. As shown, a first end of the impedance element 1002 is electrically connected to the source contact 324 by way of bonding materials 444 and 454, and a second end of the impedance element 1002 is electrically connected to the first metal material 432 in via 472 by way of the source interconnect metal 435. An additional source interconnect metal 435' can optionally be electrically connected to the first end of impedance element 1002, where the additional source interconnect metal 435' electrically connects all of the source fingers to one another. Similar modifications can also be made to the connection between the drain contact and the drain interconnect metal in order to insert an impedance element therebetween.

Although in FIG. 10 the impedance element 1002 is shown to be formed over dielectric material 439 and/or over the surface of base substrate 104, other configurations are possible as well. For example, the impedance element 1002 can be formed inside (e.g., within) the dielectric material 439. That is, dielectric material 439 may be formed of two (or more) dielectric layers, and the impedance element 1002 can be formed between the two dielectric layers. Furthermore, source interconnect metal 435 may include multiple metal wiring layers.

Figure 11:
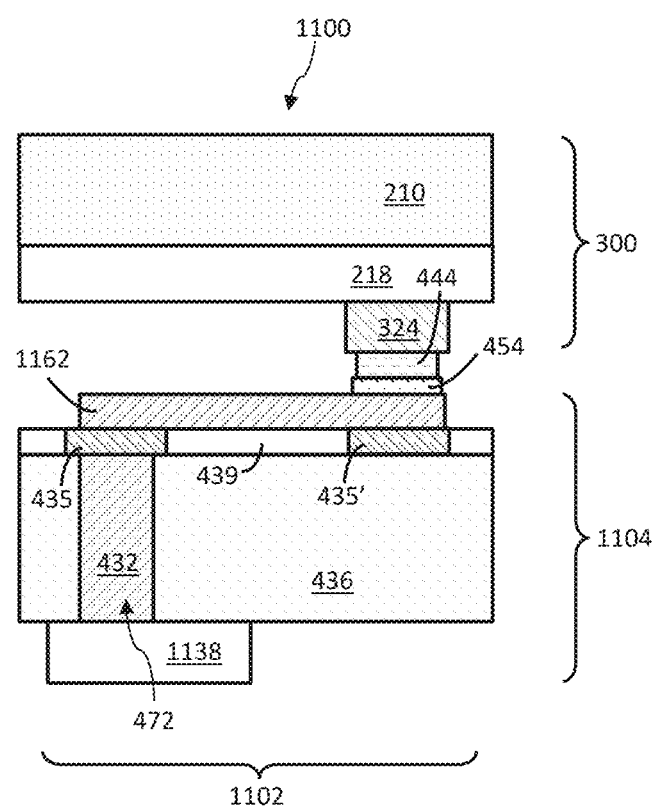
FIG. 11 is a cross-sectional view of an implementation of a semiconductor device that includes an inductive element integrated into the base substrate.

FIG. 11 is a cross-sectional view of another semiconductor device 1100 that is similar to that shown in FIG. 10 but with an inductive element 1102 (which is a type of impedance element) integrated into the base substrate 1104. That is, the base substrate 1104 includes an integrated inductive element 1102 which comprises frontside metal layer 1162, backside metal layer 1138, and first metal material 432 in via 472. The view shown in FIG. 11 corresponds to the cross section along dashed line 1270 in FIG. 12.

Figure 12:
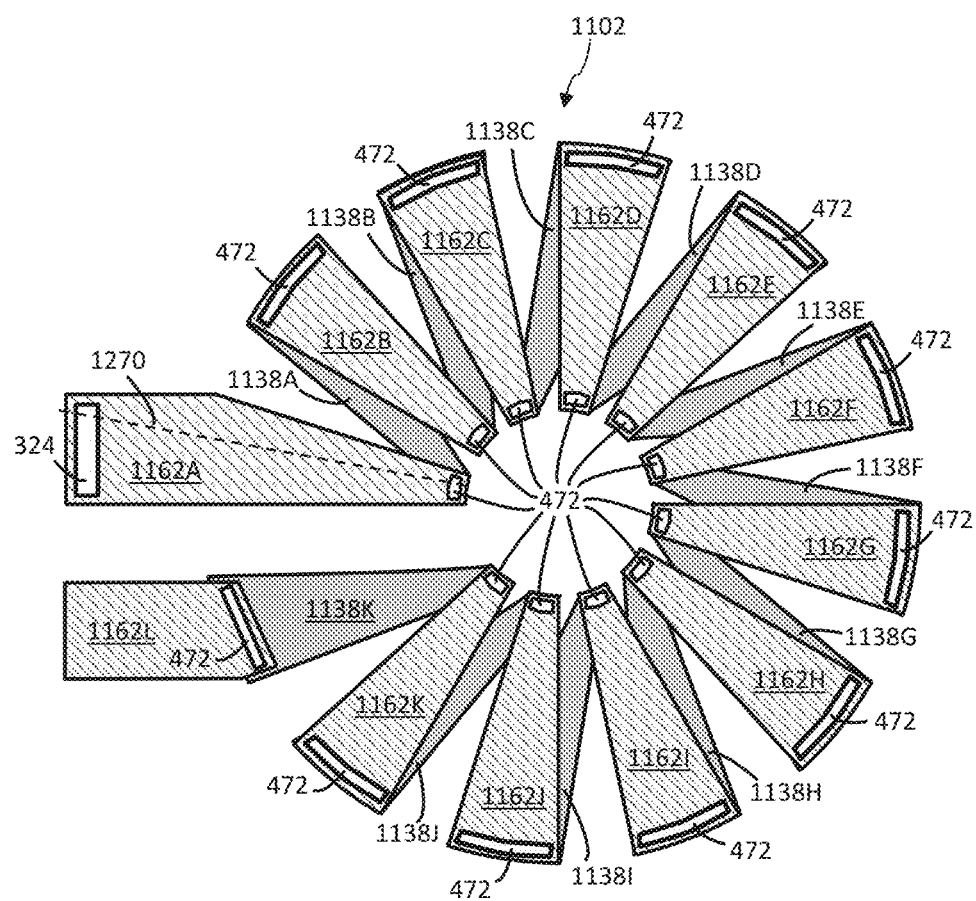
FIG. 12 is a plan view of the inductive element in FIG. 11.

FIG. 12 is a plan view of the entire inductive element 1102 (with the substrate layer 436 omitted for clarity). As seen in FIG. 12, frontside metal layer 1162 is patterned into a plurality of segments 1162A-1162L, and backside metal layer 1138 is patterned into a plurality of segments 1138A-1138K. Segment 1162A is conductively connected to segment 1138A by way of the first metal material 432 in a first via 472 that is common to these two segments, segment 1138A is conductively connected to segment 1162B by way of the first metal material 432 in a second via 472 that is comment to these two segments, and so forth. Accordingly, current that enters the inductive element 1102 from contact 324 first passes through segment 1162A, then down through a first via 472 into segment 1138A, then through segment 1138A and up through a second via 472 into segment 1162B, and so forth, until finally the current passes through segment 1162L and exits the inductive element 1102. The configuration shown for inductive element 1102 in FIG. 12 is in the form of a toroidal inductor, although other types of inductors may also be formed through alternative configurations, as further described below.

Figure 13:
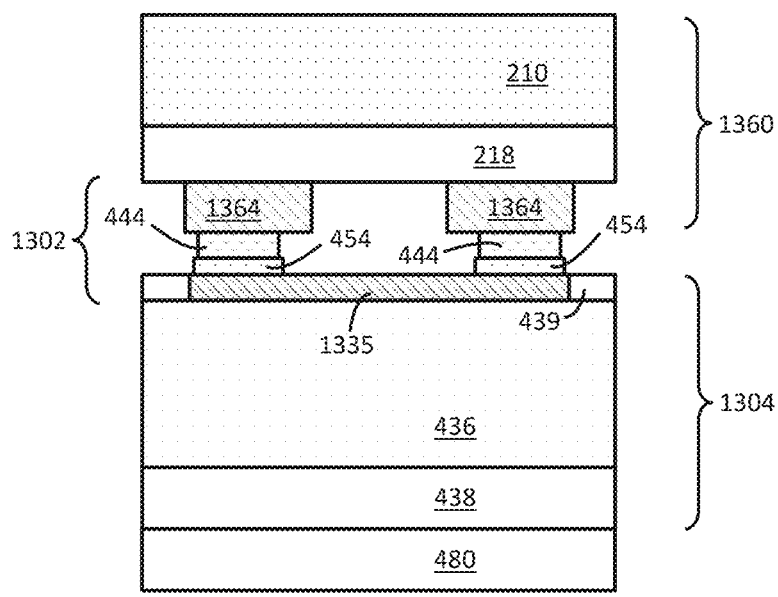
FIGS. 13 and 14 are cross-sectional and plan views, respectively, of portions of another inductive element.

FIG. 13 is a cross-sectional view of a portion of another inductive element 1302 that can be used with or integrated into the semiconductor devices described herein. Additional components of the entire inductive element 1302 are shown in the plan view of FIG. 14. The view shown in FIG. 13 corresponds to the cross section along dashed line 1470 in FIG. 14. Inductive element 1302 is formed of first metal layer 1364 that is over the materials 210 and 218 of chiplet structure 1360, bonding materials 444/454, and frontside metal layer 1335 of base substrate 1304. Accordingly, the complete structure of inductive element 1302 is only formed after chiplet structure 1360 is connected (e.g., bonded) to base substrate 1304.

Figure 14:
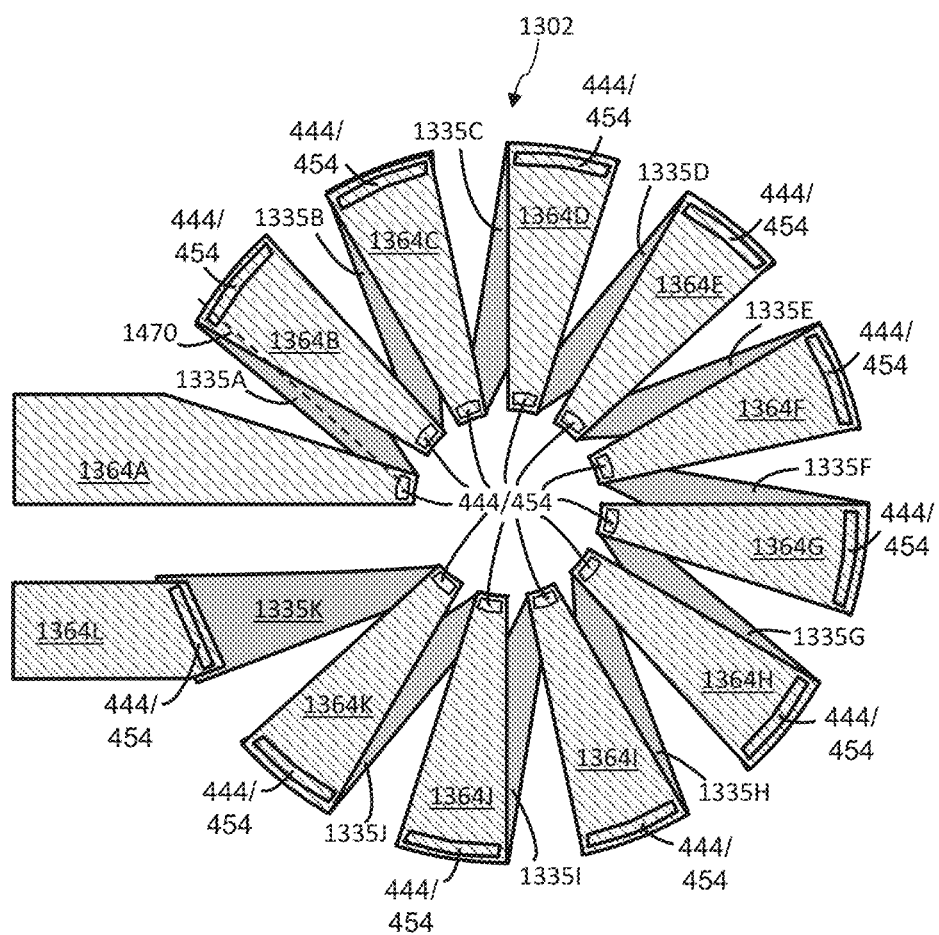

FIG. 14 is a plan view of the entire intrinsic portion of inductive element 1302. As seen in FIG. 14, first metal layer 1364 is patterned into a plurality of segments 1364A-1364L, and frontside metal layer 1335 is patterned into a plurality of segments 1335A-1335K. Segment 1364A is conductively connected to segment 1335A by way of a first stack of bonding materials 444/454, segment 1335A is conductively connected to segment 1364B by way of a second stack of bonding materials 444/454, and so forth. Accordingly, current that enters the inductive element 1302 first passes through segment 1364A, then down through a first stack of bonding materials 444/454 into segment 1335A, then through segment 1335A and up through a second stack of bonding materials 444/454 into segment 1364B, and so forth, until finally the current passes through segment 1364L and exits the inductive element 1302. The configuration shown for inductive element 1302 in FIG. 14 is in the form of a toroidal inductor, although other types of inductors may also be formed through alternative configurations, as further described below.

Figure 15:
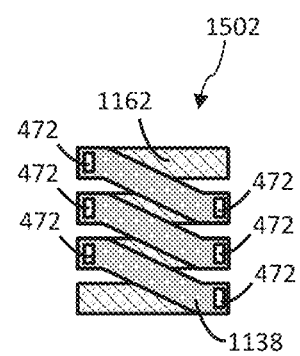
FIGS. 15-18 illustrate example configurations of other inductive elements.
Figure 16:
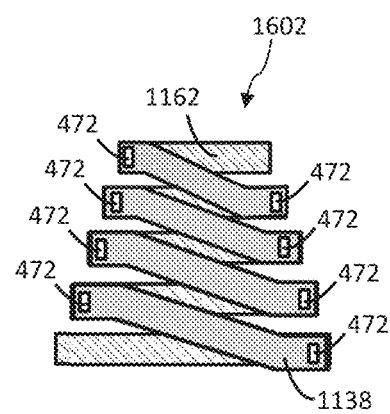
Figure 17:
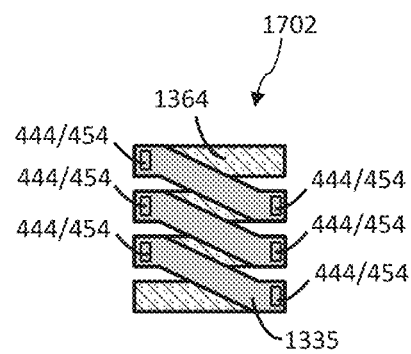
Figure 18:
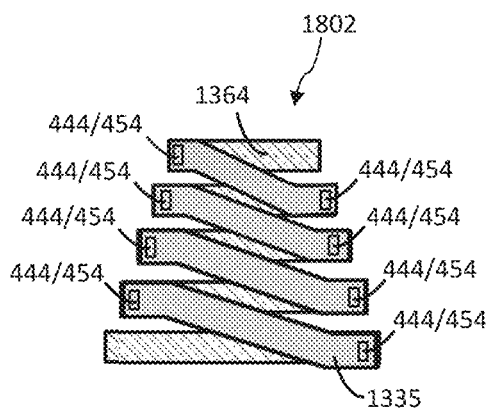
Figure 19:
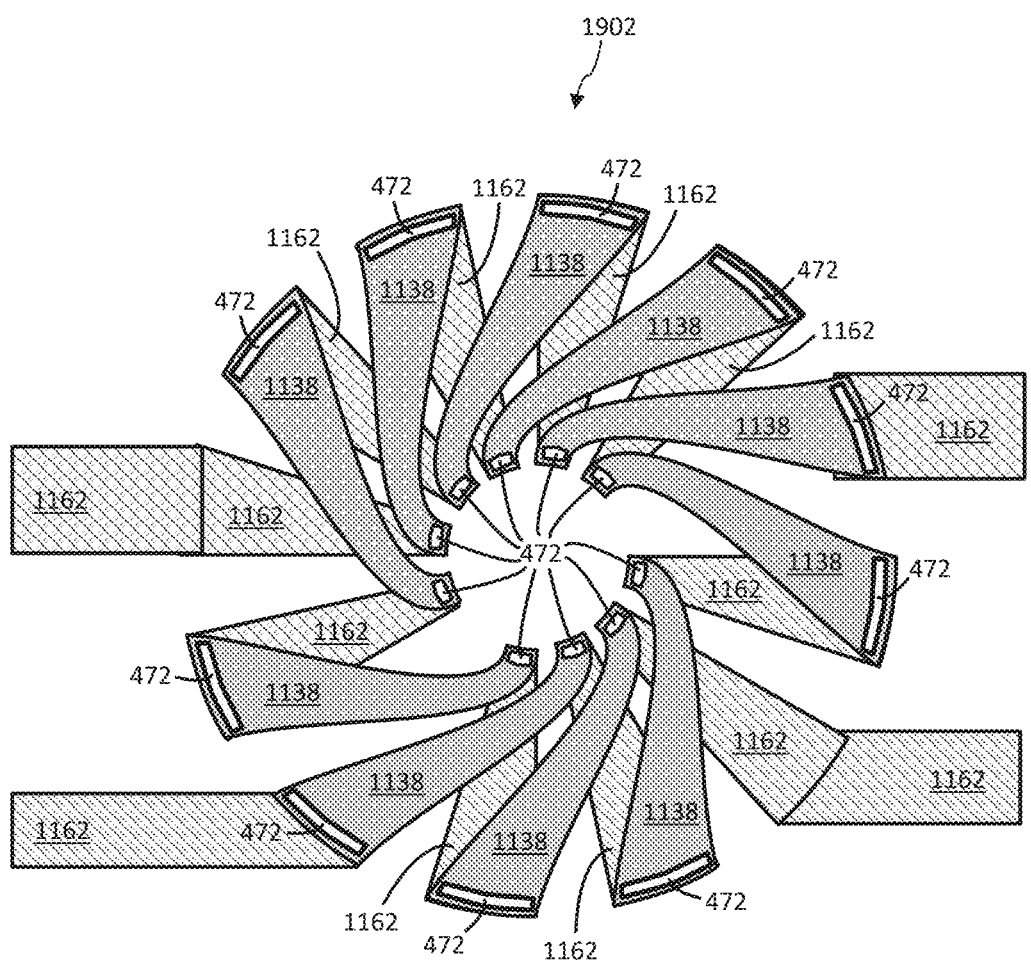
FIGS. 19-20 illustrate example configurations for toroidal transformers.
Figure 20:
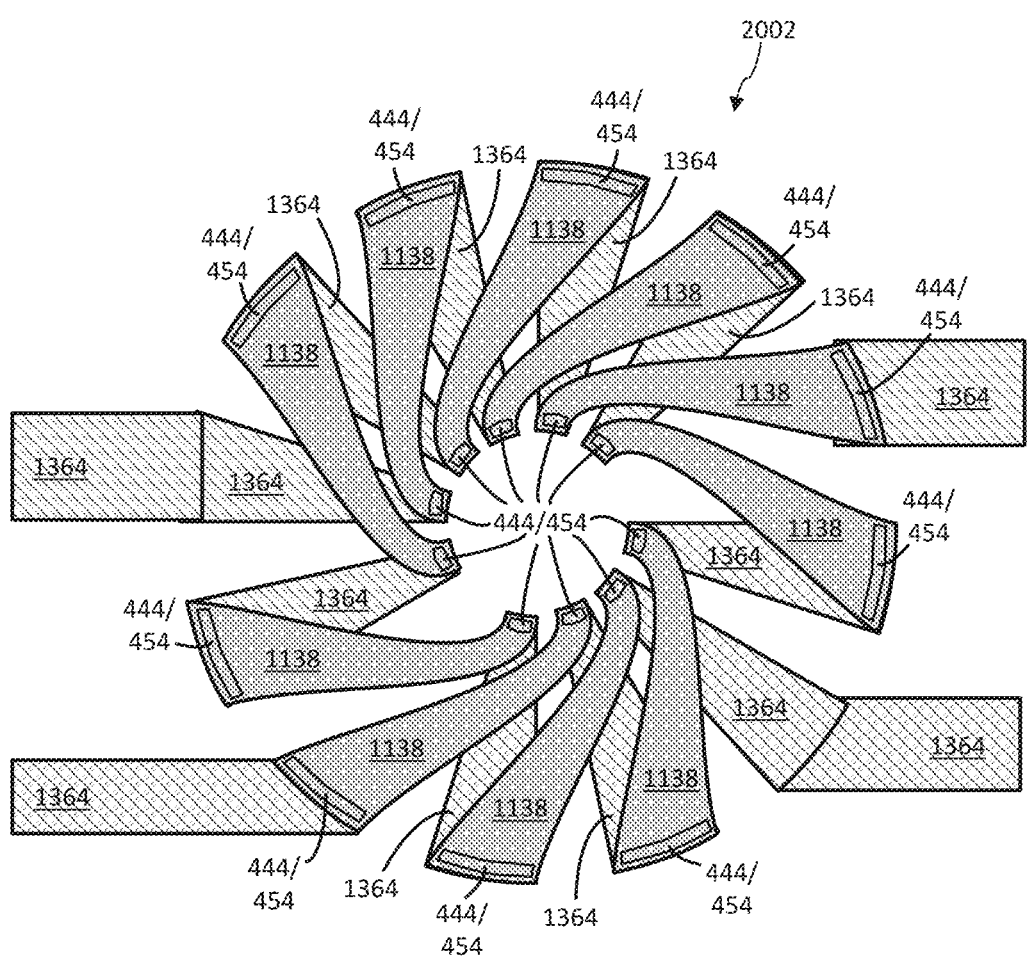

FIGS. 15-16 are configurations for inductive elements 1502 and 1602, respectively, that can be formed using the same materials and fabrication technology as inductive element 1102 of FIGS. 11-12, and FIGS. 17-18 are configurations for inductive elements 1702 and 1802, respectively, that can be formed using the same materials and fabrication technology as inductive element 1302 of FIGS. 13-14. FIGS. 15 and 17 are plan views of axial inductors, and FIGS. 16 and 18 are plan views of conical axial inductors. FIGS. 19-20 are configurations for toroidal transformers 1902 and 2002, respectively. Transformer 1902 can be formed using the same materials and fabrication technology as inductive element 1102 of FIGS. 11-12, and transformer 2002 can be formed using the same materials and fabrication technology as inductive element 1302 of FIGS. 13-14.

As described earlier, each chiplet can contain multiple N-polar III-N transistors that are bonded to the base substrate. Accordingly, in addition to the single N-polar III-N transistor shown bonded to a base substrate in FIGS. 4, 6, 7, 10, and 11, any of the semiconductor devices described herein can include a second transistor that is similarly connected to the base substrate and includes a second III-N barrier layer and a second III-N channel layer on an N-face of the second III-N barrier layer, with the second III-N barrier layer having a larger bandgap than the second III-N channel layer. The second transistor can also include a second 2DEG channel in the second III-N channel layer adjacent to the interface between the second III-N channel layer and the second III-N barrier layer, and a second plurality of contacts, where the second plurality of contacts includes a second source contact, a second drain contact, and a second gate contact, with the second source contact, the second gate contact, and the second drain contact each being on an opposite side of the second III-N channel layer from the second III-N barrier layer, and the second source and second drain contacts being electrically connected to the second 2DEG channel.

Figure 21A:
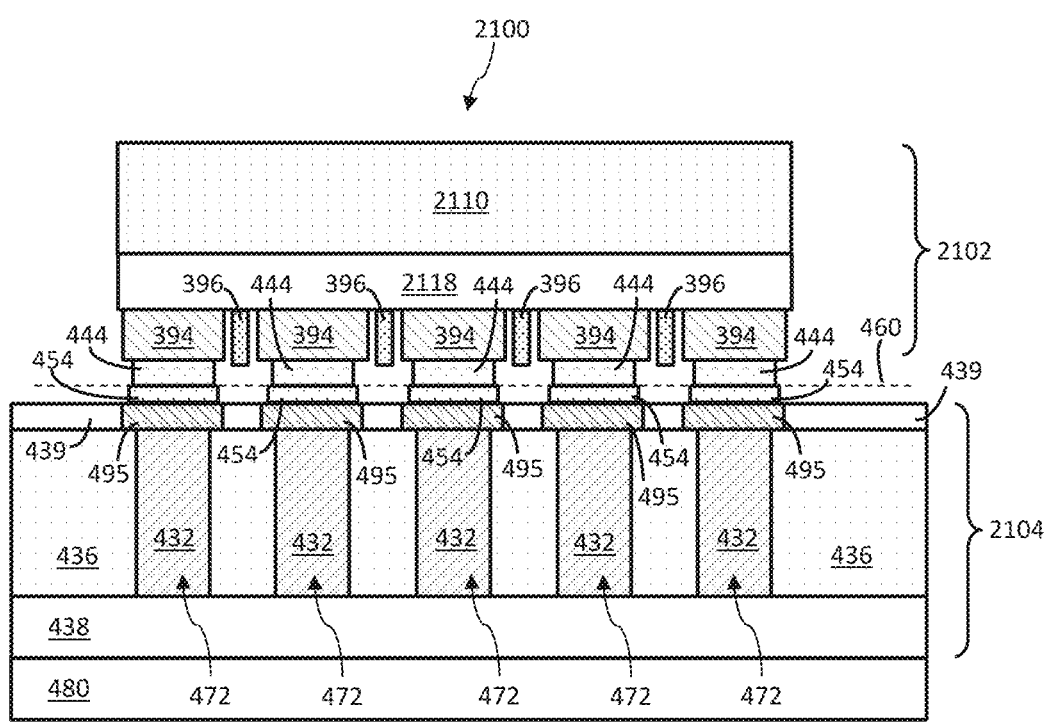
FIGS. 21A-C are cross-sectional views of implementations of semiconductor devices that include a diode connected to a base substrate.

FIG. 21A shows a cross-sectional view of an implementation 2100 of a semiconductor device in which a 2-terminal device structure such as a diode structure 2102 is connected to a base substrate 2104. The diode structure 2102 includes an anode contact (e.g., anode fingers) 396 and a cathode contact (e.g., cathode fingers) 394. Each cathode finger 394 is electrically connected (by way of bonding materials 444/454 and interconnect metal 495) to metal material 432 in a plurality of vias 472. As in other implementations described herein, each via 472 extends through the entire thickness of substrate layer 436, such that metal material 432 contacts backside metal material 438.

Figure 21B:
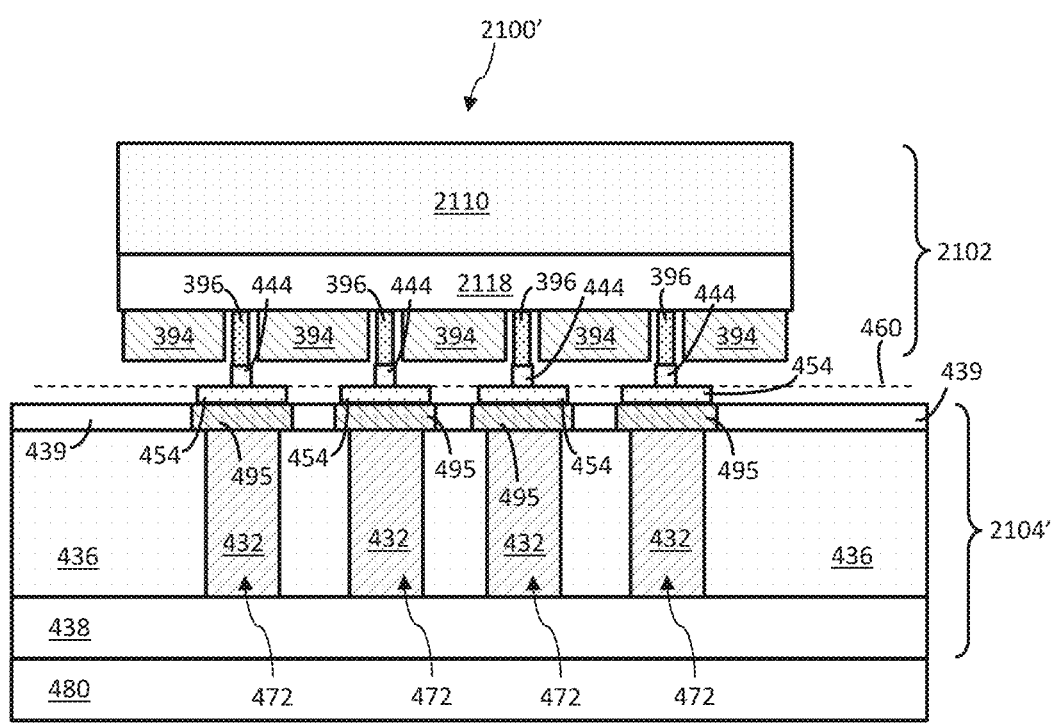

FIG. 21B shows a cross-sectional view of another implementation 2100' of a semiconductor device in which a 2-terminal device structure such as diode structure 2102 is connected to a base substrate 2104'. In the implementation shown in FIG. 21B, each anode finger 396 is electrically connected (by way of bonding materials 444/454 and interconnect metal 495) to metal material 432 in a plurality of vias 472.

Figure 21C:
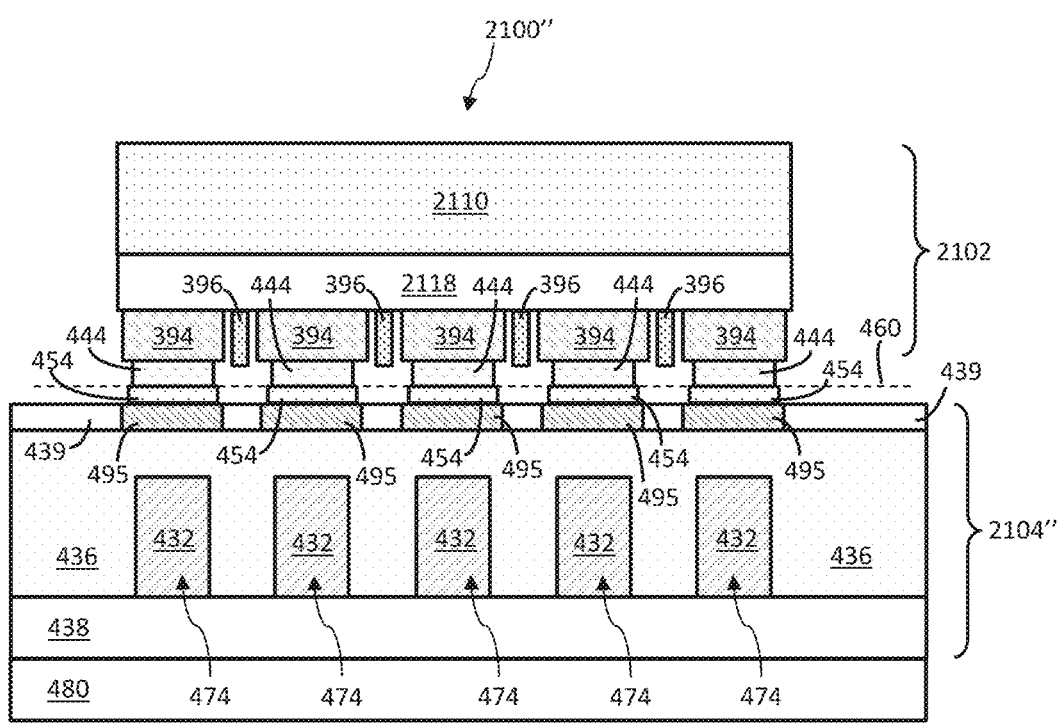

FIG. 21C shows a cross-sectional view of yet another implementation 2100" of a semiconductor device in which a 2-terminal device structure such as diode structure 2102 is connected to a base substrate 2104". In the implementation shown in FIG. 21C, the vias 474 do not extend through the entire thickness of the substrate layer 436, resulting in both the anode and cathode fingers 396 and 394, respectively, being electrically isolated from metal material 432 in the vias 474. Although not shown in FIG. 21C, similar to the structure shown in FIGS. 8A-8B and 9, the diode structure 2102 can further include one or more thermal contacts (such as thermal contact 827 in FIGS. 8A-8B and 9) that are electrically connected to the metal material 438.

Figure 22:
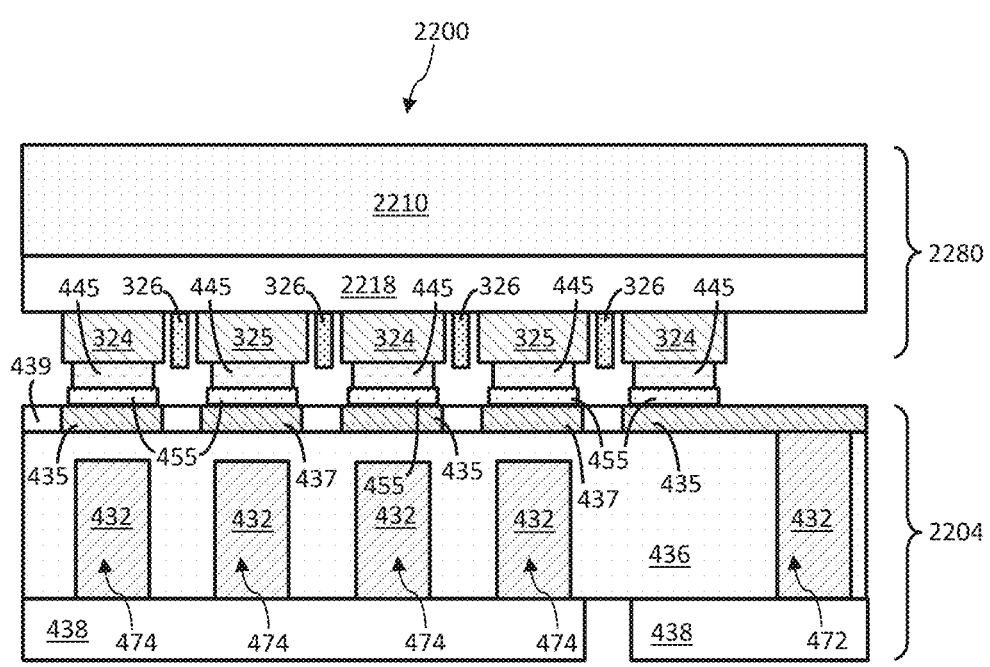
FIG. 22 is a cross-sectional view of an implementation of a semiconductor device in which the backside metal material of a substrate layer in a base substrate is patterned to form a portion of an inductor.

FIG. 22 shows a cross-sectional view of another implementation 2200 of a semiconductor device which is similar to device 400 of FIG. 4, except that metal material 438 on the back side of substrate layer 436 in base substrate 1204 is patterned to form a portion of an inductor. The source interconnect metals 435 may all be electrically connected to one another, and the drain interconnect metals 437 may all be electrically connected to one another.

Figure 23A:
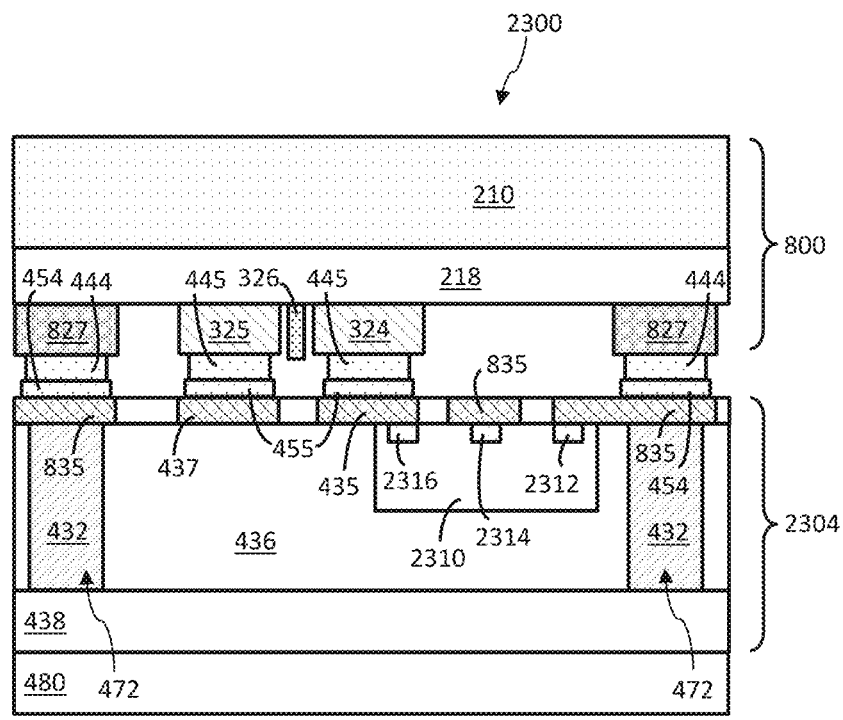
FIG. 23A shows a cross-sectional view of another implementation of a semiconductor device.

FIG. 23A shows a cross-sectional view of another implementation 2300 of a semiconductor device which is similar to device 900 of FIG. 9, except that base substrate 2304 further includes a semiconductor component 2310 formed within the substrate layer 436 of base substrate 2304, and at least one contact (e.g., source 324, drain 325, or gate 326) of the transistor structure 800 is electrically connected (e.g., bonded) to a contact of the semiconductor component 2310. In the configuration shown in FIG. 23A, semiconductor component 2310 is a bipolar junction transistor and includes an emitter contact 2312, a base contact 2314, and a collector contact 2316. The emitter contact 2312 is electrically connected to backside metal 438 by way of interconnect metal 835 and the first metal material 432 that is in at least one of the vias 472. The collector contact 2316 is electrically connected to the source finger 324 of the transistor structure 800 by way of bonding materials 445/455.

Figure 23B:
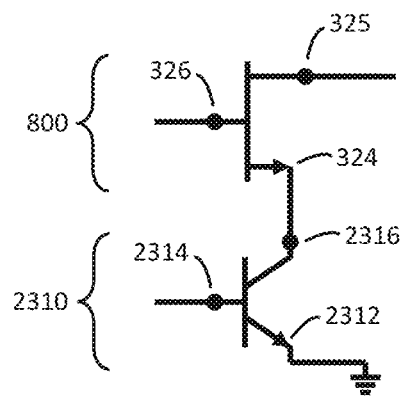
FIG. 23B is a circuit schematic of the semiconductor device of FIG. 23A.

FIG. 23B is a circuit diagram showing the connections between the contacts of transistor structure 800 and bipolar junction transistor 2310 in the case where metal plate 480 (which is electrically connected to emitter contact 2312) is connected to ground. The configuration shown in FIG. 23B is commonly known as a cascode configuration. Although not shown in FIGS. 23A and 23B, the gate finger 326 can optionally also be connected to ground and/or to emitter contact 2312, for example by bonding the gate finger 326 to an interconnect metal 835 that contacts the first metal material 432 in at least one of the vias 472, thereby electrically connecting the gate finger 326 to the backside metal 438. In some implementations, transistor structure 800 has a higher breakdown voltage than semiconductor component (e.g., bipolar transistor structure) 2310. In some implementations, transistor structure 800 is a depletion-mode device having a threshold voltage that is less than zero, and optionally semiconductor component 2310 is an enhancement-mode device having a threshold voltage that is greater than zero. Combining devices 800 and 2310 into a cascode configuration using the bonding techniques illustrated in FIG. 23A can minimize impedances in the connections between the contacts of one device to contacts of the other device while still effectively dissipating heat away from the devices during operation.

Figure 24:
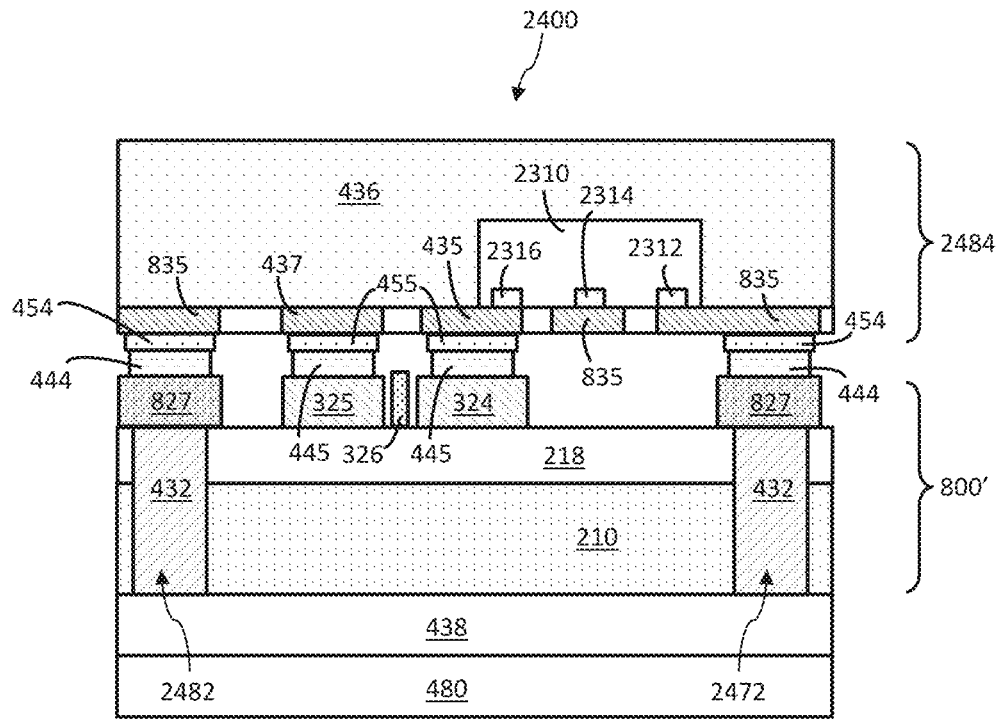
FIG. 24 shows a cross-sectional view of yet another implementation of a semiconductor device.

FIG. 24 shows a cross-sectional view of another implementation 2400 of the cascode configuration shown in FIG. 23B. In configuration 2400, the backside metal material 438 and the metal plate 480 are on the back side of the transistor structure 800' rather than on the back side of the material structure 2484 of which semiconductor component 2310 is a part of (e.g., formed within). That is, backside metal material 438 and metal plate 480 are on an opposite side of substrate 210 from III-N material structure 218. In this configuration, the substrate 210 and III-N material structure 218 can form the base substrate on which the circuit is fabricated/assembled, and the semiconductor component 2310 is provided as one or more chiplets that are bonded to the base structure. Accordingly, substrate 210, III-N material structure 218, backside metal material 438, and metal plate 480 can extend laterally beyond what is shown in FIG. 24, and can further included additional circuit components connected thereon or formed within the III-N material structure. The base substrate that includes transistor structure 800' can optionally include vias 2472/2482 containing metal material 432, similar to the vias previously shown for other devices, except that the vias 2472/2482 extend through the material of transistor structure 800' rather than through the material of the device(s) that is/are bonded thereto. Via 2472 and the metal material 432 therein, which electrically connects emitter contact 2312 to metal plate 480, can be a useful configuration for providing a low impedance electrical connection from the emitter contact 2312 to ground in the case where metal plate 480 is grounded and functions as a ground plate. Thermal via 2482 may also optionally be included for providing improved heat dissipation, although in many cases may not be necessary. Although not shown, an additional via that electrically connects gate finger 326 to metal plate 480 may optionally included in order to provide a low impedance electrical connection from gate finger 326 to metal plate 480. Alternatively, gate finger 326 can optionally be bonded directly to the emitter contact 2312 or otherwise electrically connected to the emitter contact 2312 by metal traces on the surface of the transistor structure 800'. Although the configuration 2400 shown in FIG. 24 may be more expensive to implement than other implementations described herein, it may be more effective at dissipating heat away from transistor structure 800', thereby improving the overall performance of the circuit.

Figure 25:
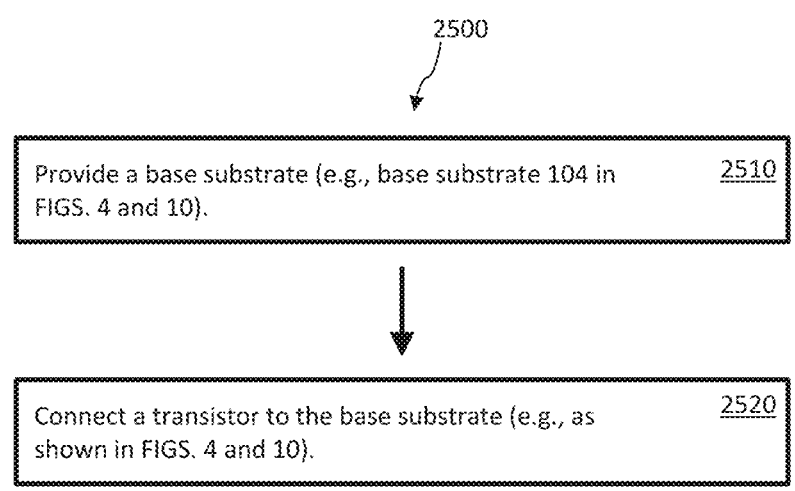
FIG. 25 illustrates a method of forming a semiconductor device.

A method 2500 of forming one or more of the semiconductor devices described herein is illustrated in FIG. 25. Method 2500 includes the step 2510 of providing a base substrate, which can, for example, be the base substrate 104 shown in FIGS. 4 and 10. Method 2500 further includes the step 2520 of connecting a transistor to the base substrate (for example, connecting transistor 300 to base substrate 104 as shown in FIGS. 4 and 10). In some implementations of method 2500, after connecting the transistor to the base substrate, the transistor is over the front side of the base substrate such that the substrate layer of the base substrate is between the backside metal and the transistor, and the first metal material in a first via of the first plurality of vias is electrically connected to a first contact of the plurality of contacts by one or more bonding materials (e.g., as in FIG. 4). In other implementations of method 2500, after connecting the transistor to the base substrate, the transistor is over the front side of the base substrate such that the substrate layer of the base substrate is between the backside metal and the transistor, and a first end of an impedance element is electrically connected to a first contact of the plurality of contacts, and a second end of the impedance element is electrically connected to the first metal material (e.g., as in FIG. 10). The source contact of the transistor that is connected to the base substrate can include a plurality of source fingers. Prior to connecting the transistor to the base substrate, the source fingers can be electrically isolated from each other. After the transistor is connected to the base substrate, the source fingers can all be electrically connected to a common conductor, thereby causing the source fingers to be electrically connected to one another.

Any of the semiconductor devices described herein can be part of or be integrated into an electronic component such as a mobile phone, a mobile or satellite base station, a radar module, a backhaul system, or a wireless access point. Or, any of the semiconductor devices described herein can be part of or be integrated into a transmitter, a receiver, or a transceiver on land, sea, or air that communicates with a satellite.

Various semiconductor devices, along with methods of forming semiconductor devices, have been described above. However, it should be understood that they have been presented by way of example only, and not limitation. Where methods and steps described above indicate certain events occurring in certain order, those of ordinary skill in the art would recognize that the ordering of certain steps may be modified and such modifications are in accordance with the variations of the disclosure. The implementations have been particularly shown and described, but it will be understood that various changes in form and details may be made. Accordingly, other implementations are within the scope of the following claims.

What is claimed is:
1. A semiconductor device, comprising:
  a base substrate, comprising:
    a substrate layer comprising a semiconductor or insulator material, the substrate layer having a front side and a back side opposite the front side;
    a first plurality of vias that each extend through an entirety of the thickness of the substrate layer;
    a first metal material and an isolation material in each via of the first plurality of vias, wherein the isolation material is between the first metal material and the substrate layer;
    a backside metal material overlying the back side of the substrate layer and contacting the first metal material in each via of the first plurality of vias; and
    an interconnect metal on the front side of the substrate layer; and
  a transistor connected to the base substrate, the transistor comprising:
    a III-N material structure, comprising:
      a III-N barrier layer;
      a III-N channel layer on an N-face of the III-N barrier layer, wherein the III-N barrier layer has a larger bandgap than the III-N channel layer; and
      a 2DEG channel in the III-N channel layer adjacent to the interface between the III-N channel layer and the III-N barrier layer; and
    a plurality of contacts, the plurality of contacts comprising a source contact, a drain contact, and a gate contact, wherein the source, gate, and drain contacts are on an opposite side of the III-N channel layer from the III-N barrier layer, and the source and drain contacts are electrically connected to the 2DEG channel; wherein
  the transistor is over the front side of the base substrate such that the substrate layer of the base substrate is between the backside metal and the transistor, and the first metal material in a first via of the first plurality of vias is electrically connected to a first contact of the plurality of contacts by one or more bonding materials.
2. The semiconductor device of claim 1, wherein at least one of the one or more bonding materials comprises gold, silver, copper, and indium containing compound, a tin containing compound, AuSn, AuSi, CuSn, AuGe, AlGe, AlSi, or a combination thereof.

3. The semiconductor device of claim 1, wherein the one or more bonding materials is directly between the first contact and the first metal material.

4. The semiconductor device of claim 1, wherein the first contact is the source contact.

5. The semiconductor device of claim 1, wherein the base substrate further comprises a second plurality of vias that each extend partially through the substrate layer without extending through an entirety of the thickness of the substrate layer.

6. The semiconductor device of claim 5, wherein the base substrate further comprises the first metal material in each via of the second plurality of vias.

7. The semiconductor device of claim 6, wherein a second via of the second plurality of vias is directly beneath a second contact of the plurality of contacts.

8. The semiconductor device of claim 1, wherein the isolation material has a lower thermal conductivity than the semiconductor or insulator material of the substrate layer.

9. The semiconductor device of claim 1, wherein the isolation material electrically isolates the first metal material from the substrate layer.

10. The semiconductor device of claim 1, further comprising a circuit element connected to the base substrate, wherein the circuit element is selected from the group consisting of a capacitor, an inductor, a transformer, a resistor, a waveguide, an antenna, an electrical resonator, an acoustic component, a piezoelectric component, a diode, and a silicon-based transistor.

11. A semiconductor device, comprising:
   a base substrate, comprising:
      a substrate layer comprising a semiconductor or insulator material, the substrate layer having a front side and a back side opposite the front side;
      a first plurality of vias that each extend through an entirety of the thickness of the substrate layer;
      a first metal material and an isolation material in each via of the first plurality of vias, wherein the isolation material is between the first metal material and the substrate layer;
      a backside metal material overlying the back side of the substrate layer and contacting the first metal material in each via of the first plurality of vias; and
      an interconnect metal on the front side of the substrate layer; and
   a transistor connected to the base substrate, the transistor comprising:
      a III-N material structure, comprising:
         a III-N barrier layer;
         a III-N channel layer on an N-face of the III-N barrier layer, wherein the III-N barrier layer has a larger bandgap than the III-N channel layer; and
         a 2DEG channel in the III-N channel layer adjacent to the interface between the III-N channel layer and the III-N barrier layer;
      a plurality of contacts, the plurality of contacts comprising a source contact, a drain contact, and a gate contact, wherein the source, gate, and drain contacts are on an opposite side of the III-N channel layer from the III-N barrier layer, and the source and drain contacts are electrically connected to the 2DEG channel; and
      a thermal contact that is thermally coupled to the III-N material structure and electrically isolated from the 2DEG channel; wherein
   the transistor is over the front side of the base substrate such that the substrate layer of the base substrate is between the backside metal and the transistor, and the first metal material in a first via of the first plurality of vias is electrically connected to the thermal contact of the transistor.

12. The semiconductor device of claim 11, wherein the base substrate further comprises a second plurality of vias that each extend partially through the substrate layer without extending through an entirety of the thickness of the substrate layer.

13. The semiconductor device of claim 12, wherein the base substrate further comprises the first metal material in each via of the second plurality of vias.

14. The semiconductor device of claim 13, wherein a second via of the second plurality of vias is directly beneath a second contact of the plurality of contacts.

15. The semiconductor device of claim 11, further comprising a circuit element connected to the base substrate, wherein the circuit element is selected from the group consisting of a capacitor, an inductor, a transformer, a resistor, a waveguide, an antenna, an electrical resonator, an acoustic component, a piezoelectric component, a diode, and a silicon-based transistor.

16. A semiconductor device, comprising:
   a base substrate, comprising:
      a substrate layer comprising a semiconductor or insulator material, the substrate layer having a front side and a back side opposite the front side;
      a first plurality of vias that each extend through an entirety of the thickness of the substrate layer;
      a first metal material and an isolation material in each via of the first plurality of vias, wherein the isolation material is between the first metal material and the substrate layer;
      a backside metal material overlying the back side of the substrate layer and contacting the first metal material in each via of the first plurality of vias; and
      an interconnect metal on the front side of the substrate layer; and
   a transistor connected to the base substrate, the transistor, comprising:
      a III-N material structure, comprising:
         a III-N barrier layer;
         a III-N channel layer on an N-face of the III-N barrier layer, wherein the III-N barrier layer has a larger bandgap than the III-N channel layer; and
         a 2DEG channel in the III-N channel layer adjacent to the interface between the III-N channel layer and the III-N barrier layer; and
      a plurality of contacts, the plurality of contacts comprising a source contact, a drain contact, and a gate contact, wherein the source, gate, and drain contacts are on an opposite side of the III-N channel layer from the III-N barrier layer, and the source and drain contacts are electrically connected to the 2DEG channel; wherein
   the transistor is over the front side of the base substrate such that the substrate layer of the base substrate is between the backside metal and the transistor; and
   a first end of an impedance element is electrically connected to a first contact of the plurality of contacts, and a second end of the impedance element is electrically connected to the first metal material.

17. The semiconductor device of claim 16, further comprising a second transistor, the second transistor comprising:
   a second III-N barrier layer;

a second III-N channel layer on an N-face of the second III-N barrier layer, wherein the second III-N barrier layer has a larger bandgap than the second III-N channel layer;

a second 2DEG channel in the second III-N channel layer adjacent to the interface between the second III-N channel layer and the second III-N barrier layer; and a second plurality of contacts, the second plurality of contacts comprising a second source contact, a second drain contact, and a second gate contact, wherein the second source contact, the second gate contact, and the second drain contact are each on an opposite side of the second III-N channel layer from the second III-N barrier layer, and the second source and second drain contacts are electrically connected to the second 2DEG channel; wherein the second transistor is connected to the base substrate at least in part by the one or more bonding materials, the one or more bonding materials further being directly between a second contact of the second plurality of contacts and the first metal material in a second via of the first plurality of vias.

18. The semiconductor device of claim 16, wherein the substrate layer comprises a material selected from the group consisting of silicon, gallium arsenide, silicon carbide, sapphire, germanium, indium phosphide, silicon oxide, and aluminum nitride.

19. The semiconductor device of claim 16, wherein the interconnect metal directly contacts the first metal material in the first via of the first plurality of vias.

20. The semiconductor device of claim 16, wherein the plurality of contacts of the transistor is between the III-N channel layer and the base substrate.

* * * * *